(12) United States Patent
Polzer et al.

(10) Patent No.: US 10,838,100 B2
(45) Date of Patent: Nov. 17, 2020

(54) APPARATUS AND METHOD FOR DATA ACQUISITION

(71) Applicant: VALE S.A., Rio de Janeiro (BR)

(72) Inventors: Benjamin David Polzer, Sudbury (CA); Peter Whyte Walker, Mississauga (CA); Gordon Fox West, Toronto (CA); Peter Anthony Hurley, Toronto (CA); Robert Leslie Scott Hogg, Toronto (CA)

(73) Assignee: VALE S.A., Rio de Janeiro (BR)

( * ) Notice: Subject to any disclaimer, the term of this patent is extended or adjusted under 35 U.S.C. 154(b) by 232 days.

(21) Appl. No.: 16/138,712

(22) Filed: Sep. 21, 2018

(65) Prior Publication Data

US 2019/0094406 A1 Mar. 28, 2019

(30) Foreign Application Priority Data

Sep. 22, 2017 (CA) ...................................... 2980061

(51) Int. Cl.
*G01V 3/17* (2006.01)
*G01V 3/15* (2006.01)
(Continued)

(52) U.S. Cl.
CPC ............. *G01V 3/17* (2013.01); *F16M 11/14* (2013.01); *F16M 13/02* (2013.01);
(Continued)

(58) Field of Classification Search
CPC . G01V 3/12; G01V 3/165; G01V 3/15; G01V 3/38; G01V 7/16; F16M 11/14;
(Continued)

(56) References Cited

U.S. PATENT DOCUMENTS

| | | | |
|---|---|---|---|
| 6,369,573 B1 * | 4/2002 | Turner | F16F 15/023 324/331 |
| 2003/0169045 A1 * | 9/2003 | Whitton | G01V 3/105 324/330 |

(Continued)

FOREIGN PATENT DOCUMENTS

| WO | WO 2013170340 A1 | 11/2013 |
|---|---|---|
| WO | WO 2014146184 A1 | 9/2014 |
| WO | WO 2015103608 A1 | 7/2015 |

*Primary Examiner* — Ryan D Walsh
(74) *Attorney, Agent, or Firm* — Arent Fox LLP

(57) ABSTRACT

Aspects of the disclosure may reduce motion noise by mounting vector component sensors on a bottom-weighted instrument platform that is supported with a spherical bearing. An apparatus for data acquisition is provided. The apparatus includes a base assembly, a spherical bearing mounted to the base assembly, and an instrument platform having at least one vector component sensor fixed thereto. The instrument platform is mounted on and supported by the spherical bearing. The spherical bearing couples the instrument platform to the base assembly and allows free angular rotation of the instrument platform, within a tilt angle range. The instrument platform is bottom weighted in that it has a center of mass disposed below its center of rotation. The apparatus may include a controller that receives and/or stores data from the at least one sensor.

25 Claims, 17 Drawing Sheets

(51) Int. Cl.
*G01R 33/022* (2006.01)
*G01V 3/165* (2006.01)
*F16M 11/14* (2006.01)
*F16M 13/02* (2006.01)
*G01V 3/38* (2006.01)
*B64C 39/02* (2006.01)
*B64D 3/00* (2006.01)

(52) U.S. Cl.
CPC .............. *G01R 33/022* (2013.01); *G01V 3/15* (2013.01); *G01V 3/165* (2013.01); *G01V 3/38* (2013.01); *B64C 39/02* (2013.01); *B64D 3/00* (2013.01)

(58) Field of Classification Search
CPC .......... F16M 13/02; B64C 39/02; B64D 3/00; F16C 23/00
See application file for complete search history.

(56) References Cited

U.S. PATENT DOCUMENTS

| | | |
|---|---|---|
| 2011/0175604 A1 | 7/2011 | Polzer et al. |
| 2013/0200248 A1 | 8/2013 | Polzer et al. |
| 2015/0034795 A1 | 2/2015 | Polzer |

\* cited by examiner

APPARATUS AND METHOD FOR DATA ACQUISITION

CROSS-REFERENCE TO RELATED APPLICATION

This application claims priority to Canadian Patent Application No. 2980061, filed Sep. 22, 2017, the disclosure of which is hereby incorporated by reference in its entirety.

FIELD OF THE DISCLOSURE

The present disclosure relates to the acquisition of vector component data. More particularly, the disclosure relates to acquisition of data from a moving carrier.

BACKGROUND

Electromagnetic (EM) survey systems detect electromagnetic fields scattered from the Earth, and are widely used for mapping its electrical properties, primarily its variations in conductivity, but also with sensitivity to polarizability, electrical permittivity and magnetic permeability. Certain electrical properties may be associated with different geological features, so electromagnetic survey data may be used to infer the presence or likelihood of various commodities such as petroleum, minerals and ground water.

An electromagnetic survey system generally responds to the presence of quasi-static time varying electrical current in the ground. The electrical properties of the Earth may be inferred by measuring the time variation of the magnetic field set up by this current with a magnetic field sensor. The time varying fields can be established by a local transmitter antenna in the case of controlled-source, or by the ambient geomagnetic fields in the case of natural-source systems.

A moving electromagnetic survey system may use a moving carrier to transport and support the magnetic field sensor as data are being acquired. In a moving electromagnetic survey system, the carrier may comprise a towed bird (or sonde) that may be suspended below an aircraft from a tow cable. Popular varieties of airborne electromagnetic (AEM) prospecting systems tow a bird below a helicopter, typically with a tow cable ranging from 30 to 90 meters in length. AEM surveys are typically configured to cover an area with parallel flight lines separated with fixed lateral separation.

To detect the presence of deep geological features, it is advantageous to acquire low frequency EM data. Presently, AEM systems are typically limited to acquiring data at frequencies of 20-25 Hz and above. Acquiring data in the sub-25 Hz range would allow geological features to be detected that may be undetectable with present-day AEM systems. In the sub 25 Hz band, the magnetic field strength from conductivity variations detected with EM systems is generally proportional to frequency. As the acquisition frequency of an electromagnetic system is lowered, magnetic fields scattered from those conductivity variations becomes weaker. To detect conductivity variations from deep structures in the Earth, picoTesla magnetic field sensitivities may be required.

Electromagnetic survey systems generally detect EM fields with vector component sensors. Many kinds of vector component magnetic (EM) sensors may be used to make an electromagnetic field measurement, including search coils, feedback coils, squids, fiber-optic and fluxgate magnetometers. In cases where the magnetic field is detected with a coil, in accordance with Faraday's Law, the EMF output from the coil becomes proportionally weaker with decreasing frequency, and so larger sensor coils may be required to compensate for decreasing sensitivity at low frequencies. Electromagnetic sensors may be "DC-Coupled", having sensitivity to a steady-state field or "AC-Coupled" having no sensitivity to a steady-state field.

EM survey systems are distinct from magnetic survey systems, which measure the static magnetic field of the Earth. The latter is generally concerned with measuring the variations in the Earth's static magnetic field that are generally attributed to magnetic permeability variations. The time varying field may be orders of magnitude smaller than the static field, often by factors of millions. Making a high quality electromagnetic measurement therefore requires limiting the rotational motion of a vector component EM sensor in the static magnetic field over the duration of a measurement. As lower frequency electromagnetic data are acquired, the duration over which this rotational motion should be limited increases. At low frequencies, the rotational stability of a vector component EM sensor often becomes a paramount consideration. Noise in an electromagnetic measurement caused by the rotation of a vector component magnetic sensor in the background static magnetic field of the Earth may be referred to as motion noise.

The static magnetic field of the Earth has a magnitude on the order of 50,000,000 pT. To limit motion noise to 1 pT, it may be necessary to limit the rotational change to the order of 1/50,000,000 radians over the duration of a measurement. To limit motion noise to 10 pT, it may be necessary to limit the rotational change to the order of 1/5,000,000 radians. A field may be considered to be substantially static if it changes at a frequency lower than the acquisition band used to measure the sensed vector field data.

Rotational motion noise may be computed from the following motion noise equations. For a vector component coil sensor pointing in the direction described by unit vector m, the rotational noise, Nc, may be written as $$Nc = m \cdot (\omega \times B),$$

where $\omega$ represents the angular velocity of the coil sensor with respect to the static field of the Earth, B. This relation was described by Dodds in patent WO2013/170340A1. For a vector magnetometer, with dipole moment m, the rotational noise, Nm is $$Nm = m \cdot (\Delta \Theta \times B),$$

where $\Delta \Theta$ represents the angular change in orientation of the magnetometer with respect to the static magnetic field of the Earth during a measurement interval.

For convenience, the angular change in orientation or the angular velocity may be referred to as "angular motion" and the resulting signal due to the angular motion of a vector component sensor in the presence of the Earth's background field is referred to as "motion noise". Motion noise may be similarly defined for other field entities in addition to the magnetic field, and similar motion noise equations may apply to vector component sensors that detect small time-varying fields where a comparatively large, background field in which the sensor is moving is present. Motion noise may be present when a background vector field is superimposed on a smaller time varying vector field that is the subject of measurement, where both vector fields are detected by a common vector component sensor mounted on a moving platform subject to angular motion, and where the detecting axis of the sensor is set by the orientation of the instrument platform upon which it is mounted. In general then, motion noise N from angular motion A of a vector component sensor in background field F may be written:

$$N = m \cdot (A \times F).$$

Motion noise differs from pointing error effects. Pointing error effects generally occur when detecting radiative fields from a source in particular direction through an aperture that is pointed at it. An aperture generally selects the signal from a specific location, and improves the signal strength from the source in comparison with a background field in the same frequency band. In the case of motion noise, the sensor is generally insensitive to the direction of the source, and apertures are not generally useful.

Motion noise may occur, for example, when quasi-static or potential fields or their field gradients are being measured with a vector component sensor. In these cases, the motion noise is insensitive to the direction of the source. In quasi-static EM and gravity measurements, for example, a vector sensor may be used to detect a signal from a source in the presence of a much larger static or substantially static background field. It is the angular motion of the vector component sensor in the background field that causes sensitivity of the vector measurement to the background field, and this is the source of motion noise. Thus, motion noise is distinct from pointing error which is sensitive to the direction of the source.

Solutions dealing with pointing error effects typically differ from solutions dealing with motion noise effects. Pointing error generally concerns the acquisition of focused radiative fields in frequency bands distinct and well separated from motion of the instrument platform where a substantial background field may or may not be present. Solutions dealing with motion noise are concerned with the acquisition of vector component fields that overlap the frequency band in which the instrument is moving, and where a background field is necessarily present. Pointing error is thus concerned with sustaining a direction over the duration of acquisition, and may be present in scalar (amplitude) measurements. Motion noise concerns limiting angular motion within the acquisition bandwidth of the desired vector measurement, and by definition cannot be present when scalar (amplitude) measurements are made.

The problem of controlling motion noise is not unique to airborne electromagnetic systems, and occurs in the field of airborne gravity measurements. As in the case of airborne electromagnetic measurements, very small time varying changes in a sensed vector field may be measured in the presence of a much larger substantially static background field. In the field of gravity, the small time varying changes are in the gravitational acceleration caused by density variations in the Earth's crust that are measured as the gravity system is moved from place to place. Likewise, motion noise may be present in a gradient measurement when a background gradient field is present.

Other designs for rotationally isolated instrument platforms, such as are typically used for camera, inertial or in gravity gradiometer applications do not address the operational requirements of an electromagnetic sensing system and are not suitable to high resolution electromagnetic data acquisition. Requirements for electromagnetic measurements may include a low electromagnetic noise environment. Highly resistive components with a low magnetic permeability and exceptionally low vibrational noise may be preferred in EM acquisition systems.

U.S. Patent App. Publication No. 2011/0175604 (Polzer et al.), which is incorporated herein by reference, teaches an approach for acquiring low frequency EM data from a moving carrier. Polzer teaches EM sensors on a center-balanced instrument platform supported by a spherical air bearing.

International PCT Patent App. Publication No. WO 2015/103608 A1 (Meyer et al.), which is incorporated herein by reference, teaches a center-balanced instrument platform mounted on an air-bearing in, "Gravity Gradiometer System with Spherical Air Bearing Based Platform". Meyer teaches augmenting a center-balanced instrument platform with actuators and springs to control the platform's range of motion. However, while these orientation stabilizing devices may have the advantage of limiting the range of motion, they may be vectors through which motion noise may be transmitted from the carrier to the sensors mounted on the instrument platform.

Such conventional orientation stabilization devices may introduce a source of vibrational noise or torque, which may reduce the quality of the data. The motion noise that may be introduced by such orientation stabilization systems may contaminate a high precision electromagnetic measurement, and may be difficult to predict and remove. Thus, orientation stabilization may even defeat the kinematic advantages achievable by center-balancing the instrument platform.

Thus, improved methods and systems for acquiring low noise, high bandwidth vector component geophysical data, and in particular vector component magnetic field data ("EM survey data") from a moving carrier, particularly in the sub-25 Hz band.

SUMMARY

The present disclosure provides methods and apparatuses for acquiring electromagnetic survey data from a moving carrier. Some embodiments disclosed herein may allow for acquiring electromagnetic survey data with low motion noise. The apparatus disclosed herein may be deployed in mobile or stationary carriers to acquire EM data in the air, on the ground and on or under the sea. Stationary carriers may be moving due to vibrations. Embodiments are not limited to only electromagnetic survey data acquisition. The methods and apparatuses described herein may also be suitable for implementation in other applications where reduction of angular motion or motion noise in vector component field sensors is desirable.

Some aspects of the disclosure may permit electromagnetic data with low motion noise to be acquired by mounting one or more vector component EM sensors on a bottom weighted instrument platform. The instrument platform may balance on a spherical bearing that supports its weight. In so doing, the instrument platform may be substantially decoupled from the carrier's motions within a bandwidth.

According to one aspect, there is provided an apparatus for vector component data acquisition comprising: a base assembly; a spherical bearing mounted to the base assembly; an instrument platform having at least one vector component sensor fixed thereto, the instrument platform being mounted on and supported by the spherical bearing, the spherical bearing thereby coupling the instrument platform to the base assembly and allowing free angular rotation of the instrument platform, within a tilt angle range, about the spherical bearing such that the instrument platform has a center of rotation; wherein the instrument platform has a center of mass disposed below the center of rotation.

In some embodiments, the instrument platform is configured to pendulate about the center of rotation such that motion noise within an acquisition band of the at least one vector component sensor is suppressed.

In some embodiments, the instrument platform has a natural pendular frequency that is lower than a lowest frequency of an acquisition band of the at least one vector component sensor.

In some embodiments, the instrument platform is rigid.

In some embodiments, the apparatus further comprises a carrier, the base assembly being coupled to the carrier.

In some embodiments, the carrier comprises a tow frame and a linkage coupling the base assembly to the tow frame.

In some embodiments, the carrier is an airborne carrier configured to be towed by an airborne vehicle.

In some embodiments, the spherical bearing is an air bearing.

In some embodiments, the spherical bearing comprises the sole mechanical coupling between the base assembly and the instrument platform.

In some embodiments, the at least one vector component sensor comprises three independently oriented vector component sensors.

In some embodiments, the apparatus further comprises a controller, the controller comprising a processor and memory, wherein the controller receives data from said at least one sensor.

In some embodiments, the controller stores the received data.

In some embodiments, the apparatus further comprises wireless communication means, wherein the controller causes the wireless communication means to transmit the received data for storage in a database.

In some embodiments, the base assembly comprises a pedestal, the spherical bearing being mounted to the pedestal.

In some embodiments, the pedestal comprises a post disposed upwardly from the base assembly.

In some embodiments, the at least one vector component sensor comprises at least one of: at least one electromagnetic sensor; at least one gravity sensor.

In some embodiments, the at least one vector component sensor comprises at least one gradiometer sensor.

In some embodiments, the instrument platform comprises a downward facing skirt, the downward facing skirt providing clearance about the spherical bearing and base assembly to allow the instrument platform a range of tilt rotation within the tilt angle range.

In some embodiments, the apparatus further comprises: a righting system; and an angular motion measurement system, wherein the righting system applies, as a function of angular motion measured by the angular motion measurement system, righting torques to the instrument platform to cause it to rotate about the spherical bearing.

In some embodiments, the righting system comprises one of: a plurality of thrusters disposed on the instrument platform, the thrusters applying said righting torques; and a plurality of movable mass assemblies disposed on the instrument platform, the movable mass assemblies applying said righting torques.

In some embodiments, the righting torques are applied to at least one of: orient the bottom-weighted instrument platform toward its principal axis being substantially vertical; and reduce angular velocity.

In some embodiments, the apparatus further comprises an accelerometer disposed on the instrument platform, the accelerometer measuring acceleration data, and wherein the controller is configured to: receive the acceleration data; estimate wobble noise as a function of the acceleration data; and subtract wobble noise from data acquired from the at least one vector component sensor.

According to another aspect, there is provided a method for vector component data acquisition from a moving instrument platform having at least one vector component sensor fixed thereto, the method comprising: moving an apparatus comprising: a base assembly; a spherical bearing mounted to the base assembly; and the instrument platform, the instrument platform being mounted on and supported by the spherical bearing, the spherical bearing thereby coupling the instrument platform to the base assembly and allowing free angular rotation of the instrument platform, within a tilt angle range, about the spherical bearing such that the instrument platform has a center of rotation, the instrument platform having a center of mass disposed below the center of rotation; and during movement of the apparatus, acquiring vector component data using the at least one vector component sensor.

In some embodiments, the apparatus further comprises a carrier, the base assembly being coupled to the carrier, and moving the apparatus comprises towing the carrier.

In some embodiments, the instrument platform is configured to pendulate about the center of rotation such that motion noise within an acquisition band of the at least one vector component sensor is suppressed.

Other aspects and features of the present disclosure will become apparent, to those ordinarily skilled in the art, upon review of the following description of the specific embodiments.

BRIEF DESCRIPTION OF THE DRAWINGS

Aspects and embodiments of the disclosure will now be described in greater detail with reference to the accompanying diagrams, in which.

DETAILED DESCRIPTION

To control motion noise, it is desirable to isolate the angular motion of the sensor from the angular motions and vibrations of the carrier. Conventional airborne electromagnetic systems have employed bungee suspensions for this purpose. They have not generally been able to achieve the high degree of stability required to reduce motion noise to acceptable levels at frequencies below 20-25 Hz. The methods and systems disclosed herein may be particularly suited for airborne electromagnetic surveying in the 1-25 Hz range.

According to various embodiments of the present disclosure, an electromagnetic survey apparatus is disclosed for acquiring electromagnetic data that may reduce motion noise. The apparatus disclosed herein may be towed or otherwise moved by a vehicle for acquisition of geophysical survey data. Specific embodiments described herein relate to airborne apparatuses that may be towed by an airborne vehicle. However, it is to be understood that embodiments of the disclosure are not limited to moving carriers for use in airborne environments. The concepts discussed herein may be applied in other environments where reduction of motion noise is desirable. For example, the vehicle moving the apparatus may be a car, truck, train, boat, etc. In other applications, the apparatus may be not be actively moved by a vehicle and may be substantially stationary.

According to some aspects, an apparatus is provided that includes a base assembly supporting a spherical bearing, which in turn supports an instrument platform. The instrument platform is bottom-weighted and supports a vector component sensor. In other words, the center of mass of the instrument platform for at least one vector component sensor is located below the center of rotation provided by the spherical bearing. By this arrangement, the instrument platform may pendulate about the spherical bearing. This pendulum motion may have a frequency lower than the than the lowest frequency of the acquisition band of the at least one EM sensor, or at least lower than a portion of the acquisition band. If the pendular motion has a frequency lower than at least a portion of the acquisition band, motion noise may be at least partially suppressed or mitigated in that band. By suitably choosing the inertial parameters of the instrument platform, motion noise may be substantially reduced in the acquisition band of the sensors.

In some embodiments, the natural pendular frequency of the instrument platform may have a period longer than 1 second and shorter than 1000 seconds. An airborne electromagnetic survey may include this apparatus, having the bottom weighted instrument platform and base assembly, supported by a tow frame within a housing. However, as noted above, the apparatus may also be configured for use in non-airborne data acquisition systems as well.

Figure 1A:
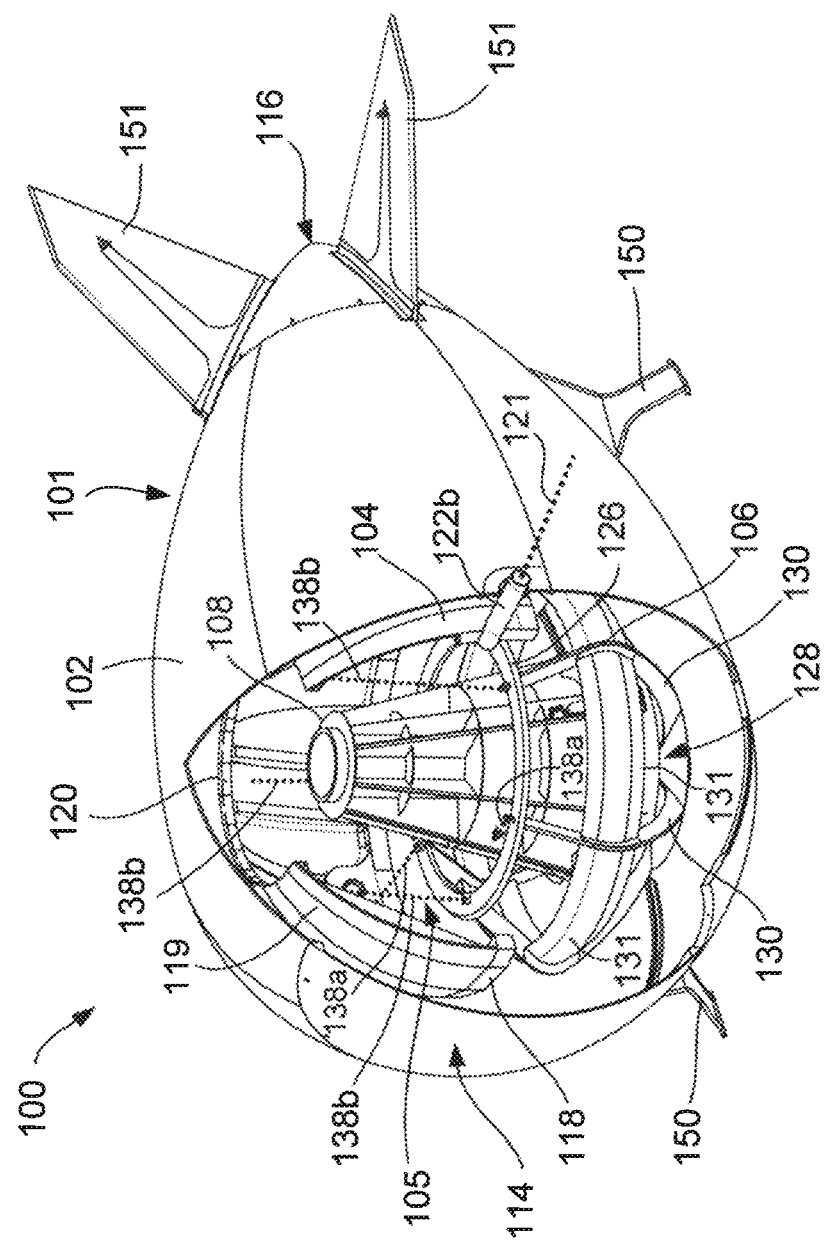
FIG. 1A is a perspective view of an apparatus for data acquisition, according to some embodiments, in which a carrier shell is shown partially cut away.

FIG. 1A is a partially cutaway perspective view of an AEM data acquisition apparatus 100 according to some embodiments. The example apparatus 100 is configured for airborne data acquisition, although embodiments are not limited to airborne systems. The example apparatus 100 includes: a carrier 101 comprising a carrier shell 102 and a tow frame 104 mounted within the carrier shell 102; a base assembly 106 coupled to the tow frame 104 by a linkage 105 (comprising the cable isolation system 123 shown in more detail in FIG. 1B in this example); a spherical bearing 110 (shown in FIG. 1B) on the base assembly; and an instrument platform 108 mounted spherical bearing 110. The instrument platform 108 in this example has vector component EM sensors 146 fixed thereto.

In some embodiments, the carrier 101, including the carrier shell 102 and the tow frame 104, and the linkage 105 are omitted. The apparatus in other embodiments may simply comprise a base assembly and an instrument platform coupled to the base assembly by a spherical bearing. The apparatus may be used with a different carrier or may be used in isolation. For example, the apparatus may be towed on a trailer. In other embodiments, the apparatus may be mounted or suspended within the vehicle itself. In still other embodiments, the apparatus may be mounted on a substantially stationary position (e.g. on a platform or building) where small motion and/or slow motion over time may still be present.

The carrier 101 in FIG. 1A is a moving carrier in that it is configured to be towed by an airplane or other airborne vehicle. The term "moving carrier" herein does not mean that the carrier is always moving, but rather the carrier may be configured for moving data acquisition. For example, other moving carriers such as trailers, towed platforms, or other means for coupling the carrier to a vehicle may be used in other embodiments.

Embodiments are not limited to the apparatus being actively moved by a vehicle. Naturally occurring movement in the ground, a structure or building may, for example, cause motion noise within an acquisition band in some applications even when the apparatus is substantially stationary. In such cases, the bottom-weighted instrument platform on a spherical bearing may reduce such motion noise.

When configured for airborne use, the carrier shell (or bird shell) 102 may be generally tear shaped with a bulbous, rounded front end 114 and a tapered tail 116 as illustrated. The carrier shell 102 may be weather proof. The tear drop shape may be a suitable aerodynamic shape for airborne sensing, although other shapes may be used. The carrier shell 102 is partially cut away to show the tow frame 104, base assembly 106 and the instrument platform 108. Fins 151 near the tail end 116 may provide some stability in flight. The carrier shell 102 is provided by way of example, and it is to be understood that other shell shapes and arrangements may be used for airborne carriers. Embodiments are not limited to the particular shape of the carrier shell 102 when a carrier is used.

The tow frame 104 in FIG. 1A includes a base support ring 118 and an upper support ring 120. Split tow axles 122a (FIG. 1B) and 122b extend away from the base support ring in opposite directions and extend outward through the carrier shell 102. Cable 103 (shown in FIG. 1B) may attach to the axles 122a and 122b of the apparatus 100 to an airborne vehicle (not shown). The upper support ring 120 may, for example, have a diameter that is approximately half that of base support ring 118. In this example, the upper support ring 120 is displaced upwards from the base support ring 118 by a distance approximately equal to its diameter. The upper and base support rings 120 and 118 are interconnected by a generally hemispherical monocoque shell 119. The axles 122a and 122b are pivotally connected to the carrier shell 102 and the tow frame 104 has a size and shape to allow for relative rotation of the tow frame 104 in the carrier about the horizontal axis 121 that runs through the split tow axles. The tow frame 104 is provided by way of example, and it is to be understood that other structures may be used to couple a base assembly (such as base assembly 106) to a carrier (such as carrier 101). For example, the base assembly may be suspended by one or more cables from an anchor or bracket located at or near the top of the carrier shell in other another embodiment. In other embodiments, the base assembly 106 may be coupled directly to the axles 122a and 122b. Embodiments are not limited to the example structure of the tow frame 104.

Although not shown in FIG. 1A, the cable isolation system 123 (shown in FIG. 1B) forms the linkage 105 between the base assembly 106 to the tow frame 104 in this example embodiment. The structure of the tow frame 104 is shown by way of example, and other tow frame or assembly structures may be used in other embodiments. For example, other suitable tow frame structures are disclosed in Polzer et al. in U.S. Patent Application Publication Nos. 2015/0034795 and 2011/0175604, which are incorporated herein by reference.

The base assembly 106 in this example comprises an upper ring-shaped rim 126 and a lower base 128 with spaced apart ribs 130 extending therebetween. The ribs 130 interconnect the base 128 and the upper rim 126. The ribs 130 are each attached to the upper rim 126. The ribs 130 extend downward, initially outward, and then curve inward to meet at the base 128. In this example, six ribs 130 are spaced apart evenly about the upper rim 126. Thus, adjacent ribs 130 are angled approximately 60 degrees with respect to one another. Other embodiments may use a different base assembly structure and may include more or fewer ribs.

Figure 1B:
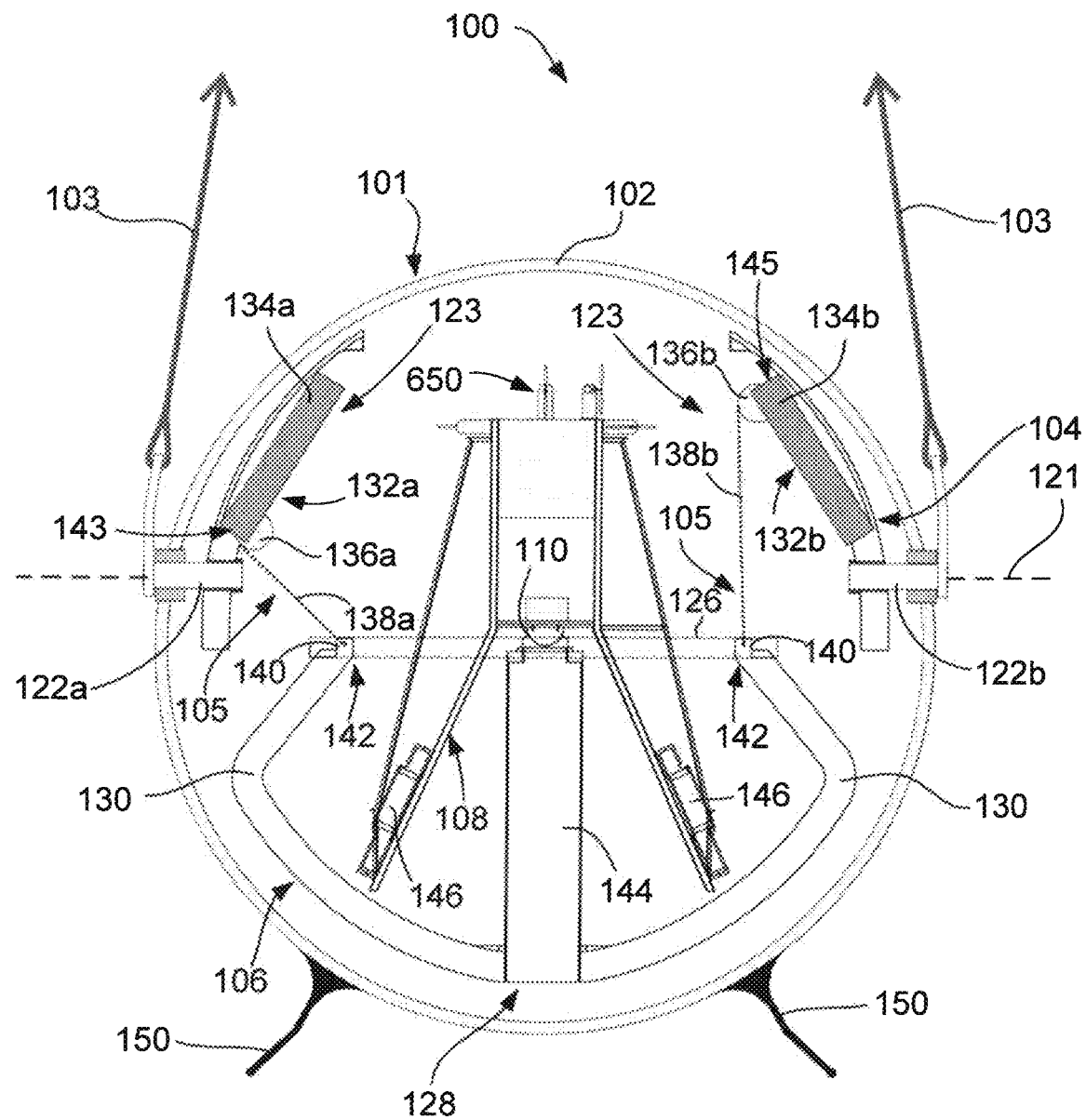
FIG. 1B is a front cross-sectional view of the apparatus of FIG. 1A.

FIG. 1B is a front cross-sectional view of the apparatus 100 of FIG. 1A. The linkage 105 between the tow frame 104 and the base assembly 106 in this example is a cable isolation system 123, and is but one possibility. However, it is to be understood that other linkage structures may also be used. See, for example, the vibration isolating damper system described by Polzer et al. in U.S. Patent App. Publication No. 2011/0175604, which is incorporated herein by reference.

The cable isolation system 123 comprises a plurality of pneumatic cable isolators 132a and 132b, one for each rib 130. Each cable isolator 132a and 132b is attached to the interior of the tow frame 104 and is aligned with a corresponding rib 130 of the base assembly 106. In this example, there are six cable isolators 132a and 132b in total (one for each rib 130). Each cable isolator 132a and 132b is in the form of a pneumatic air cylinder bearing as disclosed by Polzer et al in U.S. Patent Application Publication No. 2015/0034795. Each cable isolator 132a and 132b comprises a pair of air pistons (not shown) supported in cassette 134a or 134b. The air pistons have ends terminating on a common cross member (not shown) in this example. Each cable isolator 132a and 132b further includes a respective pulley 136a or 136b and cable 138a or 138b. Each cable 138a and 138b is attached to the respective cassette 134a or 134b and threaded over the respective pulley 136a or 136b to support the weight of base assembly 106. The cables 138a and 138b each terminate at a respective fixture 140 at an end 142 of the corresponding rib 130.

In this example, three cable isolators 132a are arranged with the cable 138a extending from a lower end 143 of the cassette 134a, such that the cable 138a extends in a partially lateral direction to the corresponding rib 130. The other three cable isolators 132b are arranged with the cable 138b extending from an upper end 145 of the cassette 134b, such that the cable 138b extends downward in a substantially vertical direction to its corresponding rib 130, as shown.

The ring-shaped rim 126 shown in FIG. 1A is shown as transparent using stippled lines in FIG. 1B so that the spherical bearing 110 is visible. Moving around the rim 126, the cable isolators 132a and 132b are arranged in an alternating fashion, such that each rib 130 that is connected to a vertically aligned cable 138b is adjacent to two ribs 130 with a partially lateral cable 138a, and vice versa. Dotted lines illustrating positions of cables 138a and 138b are also shown in FIG. 1A. The air pistons of the cassettes 134a and 134b may dampen the vibrations of the carrier 101 on base assembly 106. Each vertically supporting cable isolator 132b is spaced, in a horizontal sense, equidistantly between neighbouring laterally supporting cable isolators 132a in this embodiment. Vertical and horizontal vibrations of the carrier shell 102 and tow frame 104 may thereby be dampened by the cable isolators 132a and 132b.

With reference to FIG. 1B, the base assembly 106 comprises a pedestal 144 that extends upward from the base 128 to support the instrument platform 108 via the spherical bearing 110. The ribs 130 undergird pedestal 144, which rises vertically from the meeting point of the ribs 130 to support the spherical bearing 110 on which the instrument platform 108 sits. The pedestal is in the form of a post in this embodiment, but other pedestal structures may be used in other embodiments. The term "pedestal" used herein does not require that the pedestal extend upwardly from a base structure. For example, the pedestal may comprise one or more arms that extend at least partially horizontally or at an angle. The pedestal may be any structure suitable to support the spherical bearing and instrument platform.

Collectively the plurality of ribs 130 form a cavity to partially receive the instrument platform 108 therein and to permit the instrument platform 108 to rotate about spherical bearing 110 without colliding with the cavity sides, as best shown in FIG. 1B. In this example, the ribs 130 are structurally supported by optional panels 131.

The instrument platform 108 in this example is rigid and holds a plurality of vector component sensors 146. The instrument platform 108 may be "rigid" in that motion noise associated with deformations of the instrument platform 108 are small relative to other motion noise. The sensors 146 may be electromagnetic (EM) vector component sensors. In some embodiments, the sensors 146 may comprise three or more sensors. For example, the vector component sensors 146 may include three independently oriented vector component sensors. Some embodiments may include four or more sensors. Embodiments are not limited to particular number or arrangement of vector component sensors. The instrument platform 108 is bottom weighted such that its center of gravity is below its center of rotation about the spherical bearing.

In an alternative embodiment, the spherical bearing may be affixed directly to, or supported directly by to the carrier 101. In some embodiments, the base assembly may be part of or incorporated into the carrier. For example, in some embodiments, the spherical bearing may be mounted to the carrier, a portion of the carrier thereby functioning as the base assembly.

In some embodiments, the support of the spherical bearing 110 within the carrier may comprise features disclosed in U.S. Patent App. Publication No. 2011/0175604 (Polzer et al.).

In some embodiments, linkage between the carrier 101 and the base assembly 106 is not a cable isolation system. In some embodiments, the linkage may comprise the pneumatic vibration damping and associated systems disclosed by Polzer et al in U.S. Patent App. Publication No. 2013/0200248 (A1) and, the contents of which are incorporated herein by reference. Compressed air may be supplied from an air supply pump mounted on a tow cable and fed into the carrier through an air supply tube mounted on the tow cable.

The carrier 101 may be stabilized for airborne towing by configuring its weight distribution such that the weight of the carrier and its contents below the axis 121 is greater than the weight above it.

When the carrier 101 is lifted by an airborne vehicle, the weight is borne by its axles 122a and 122b. Carrier shell 102 may pivot about axis 121, and may not apply torque to the inner systems which may maintain their roughly upright orientation. As the vehicle begins to move forward, the air flow around the carrier shell 102 may cause the carrier shell to rotate about the horizontal axle 121. Because the carrier shell is pivotally connected to axles 122a and 122b, any such rotation may be substantially decoupled from the tow frame 104 and thus from the instrument platform 108 it supports.

Figure 1C:
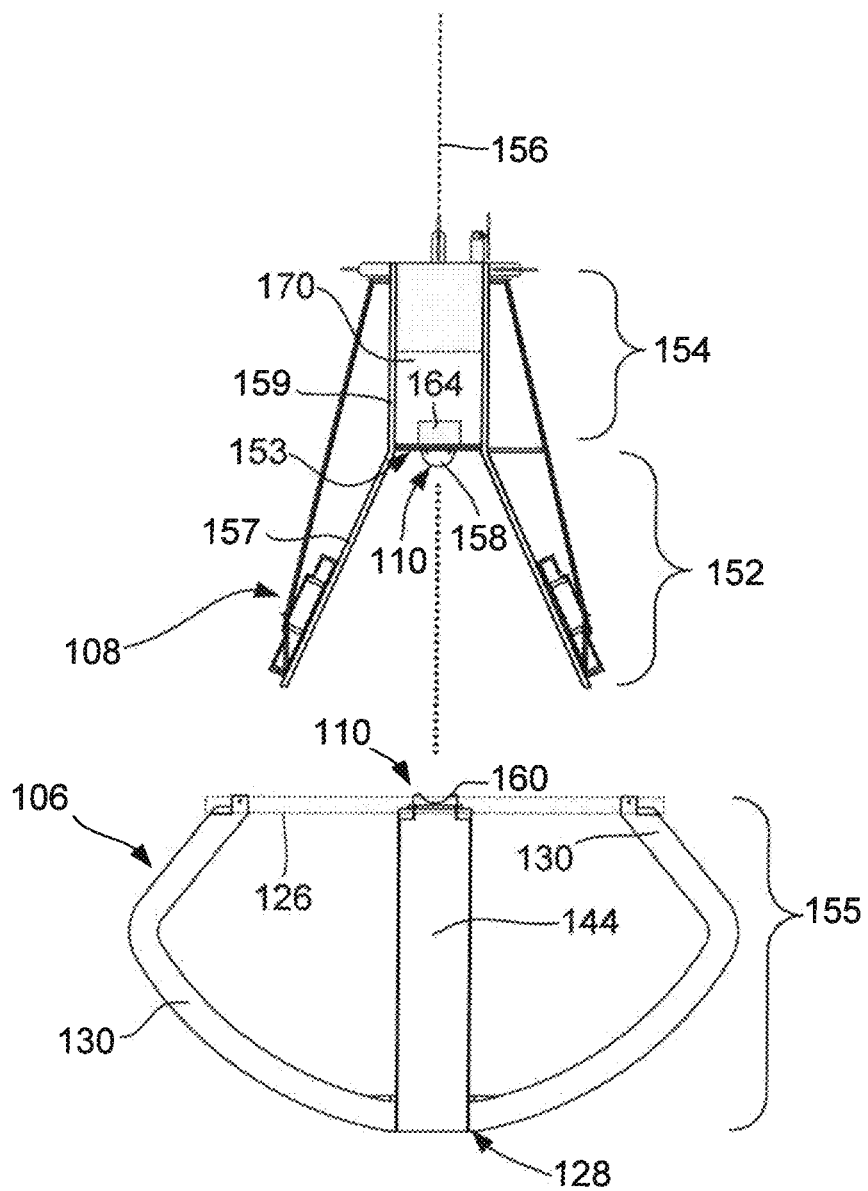
FIG. 1C is a partially exploded cross-sectional view of an instrument platform, a spherical bearing and base assembly of the apparatus of FIGS. 1A and 1B.

FIG. 1C is a cross sectional, exploded view of the base assembly 106, the spherical air bearing 110, and the instrument platform 108 in isolation according to some embodiments. The ring shaped rim 126 shown in FIG. 1A is shown as transparent using stippled lines in FIG. 1C so that the spherical bearing 110 is visible. The instrument platform 108 in this example has a lower portion 152 that comprises hollow cone (which may be a frusto-cone) 157 with an upper inside apex 153 that is engaged to and supported on the spherical air bearing 110. The instrument platform 108 also has an upper portion 154 that comprises a cylindrical part or stem 159 that extends upwardly from the cone 157, above the apex 153 and into the downward facing hemispherical cavity formed by the tow frame 104 (shown in FIGS. 1A and 1B). The instrument platform's principal axis 156 extends through the cone 157 and the stem 159. The spherical bearing 110 provides for low friction, or virtually frictionless rotation of the instrumentation platform's principal axis 156, referred to as "pivotal rotation" or "roll and pitch" as well as the rotation of the platform about its principal axis 156 which is referred to as either "rotation" or "yaw". The spherical bearing 110 is the sole mechanical coupling between the base assembly 106 and the instrument platform 108 in some embodiments.

The base assembly 106 includes a main base portion 155 (comprising the ribs 130, base 128 and rim 126) and the pedestal 144 in the form of a post which securely affixed to and extends upwardly from the main base portion 155. The ribs 130 of the base assembly 106 are sized and angled to accommodate a 10 to 30 degree roll and pitch range of the instrument platform 108 on the spherical air bearing 110.

Embodiments are not limited to the specific example structure of the base assembly 106 shown in FIGS. 1A and 1B. For example, in another embodiment, the base assembly may simply comprise a block with a pedestal thereon for supporting a spherical bearing and instrument platform. Any suitable structure for supporting the spherical bearing and instrument platform may be used.

The spherical bearing 110 in this embodiment includes a protruding, rounded part 158 attached to the instrument platform 108 and a seat 160 attached to the pedestal 144. The protruding part 158 mates with the seat 160 to allow low friction or virtually frictionless rotation.

Optional righting system 650 (discussed in more detail below with reference to FIG. 6C) is also shown on the instrument platform 108 in FIG. 1B.

Shielded electronics bay 170, which may house high precision-three component accelerometer 164 or electrically noisy components in some embodiments, is also shown in FIG. 1C.

Figure 1D:
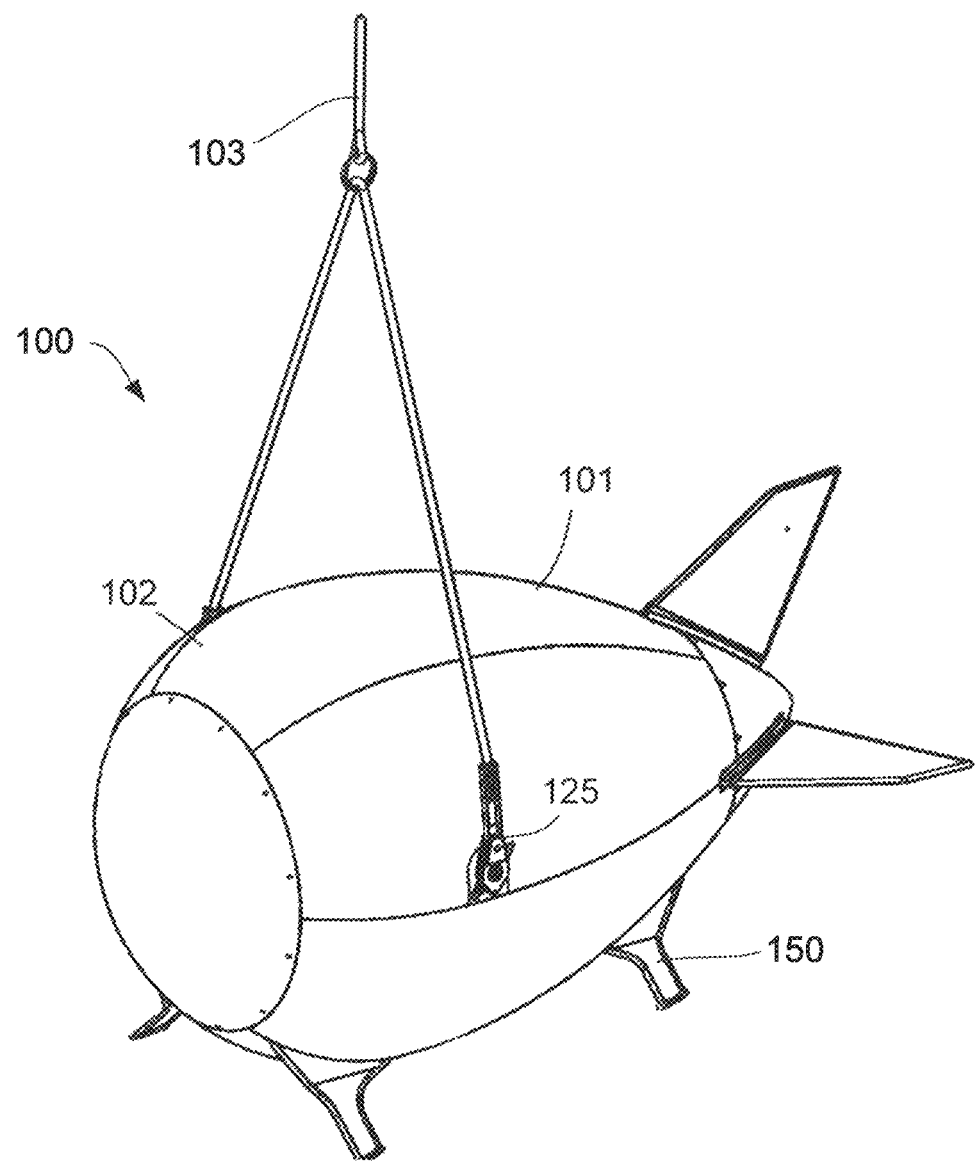
FIG. 1D is a perspective view of the apparatus of FIGS. 1A and 1B.

FIG. 1D is a perspective view of carrier 101 and cable 103. The carrier 101 is suspended from either side by the tow cable 103 which is attached to the aircraft (not shown). The tow cable 103 may split to form a pair of tow cables with the shape of an inverted "Y," where the twin prongs of the inverted "Y" are affixed to opposite sides of the carrier 101. In this embodiment, the tow cable 103 ends are affixed to rigid tow arms 125, which fixedly transfer supporting forces through axles 122a and 122b to the tow frame 104 (shown in FIGS. 1A and 1B) and carrier shell 102. In other embodiments, the tow cable 103 may attach directly or otherwise support tow frame and carrier shell. Any suitable method to connect the carrier 101 to a vehicle may be used.

Landing support feet 150 bear the weight of the carrier when it is landed on the ground. When the carrier is landed, tow cable 103 is slack and may lay on the ground. FIG. 1B illustrates the tow cable configuration for a case when the carrier may be airborne and supported by the tow cables.

In the apparatus 100 shown in FIGS. 1A to 1D, the center of rotation provided by the spherical bearing 110 is above the center of mass of the instrument platform 108, making the instrument platform "bottom weighted".

Figure 2:
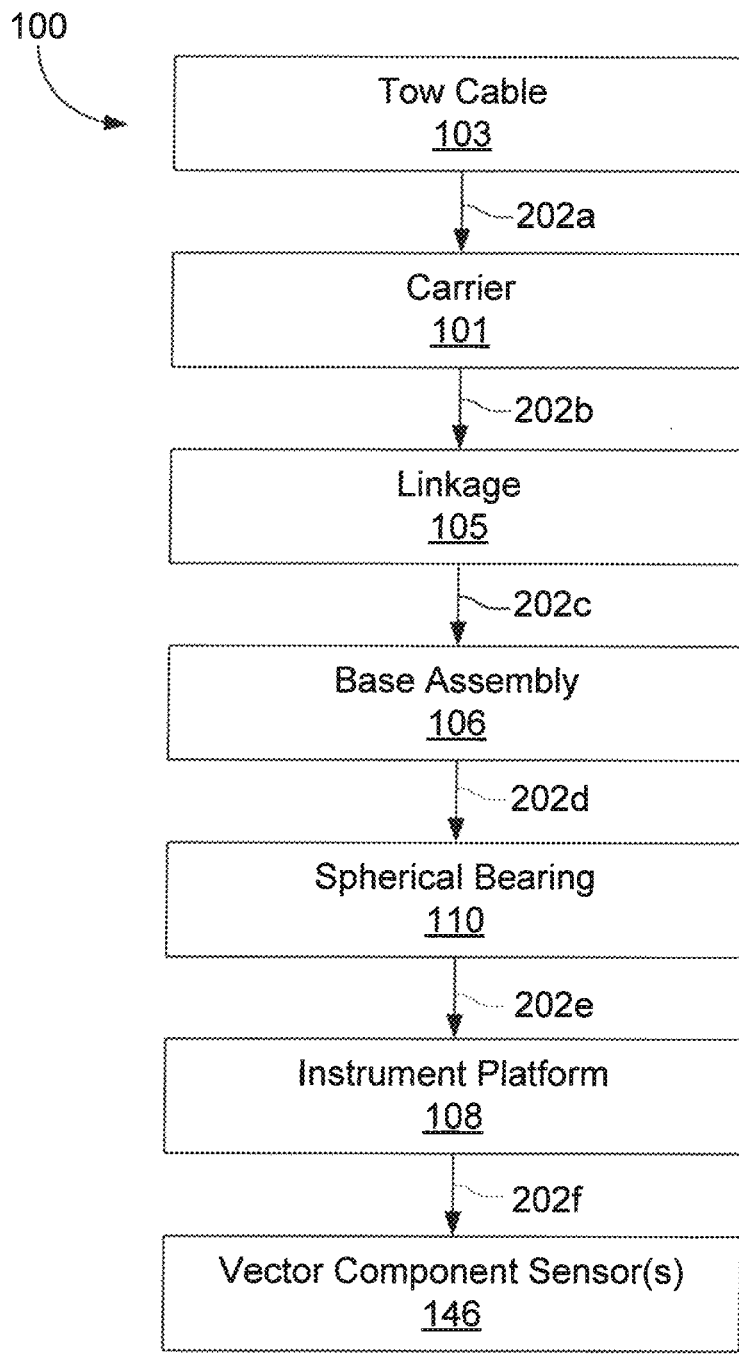
FIG. 2 is a block diagram of components of an apparatus according to some embodiments.

FIG. 2 is a block diagram illustrating a structural support arrangement of the apparatus 100 of FIGS. 1A to 1D. Arrows 202a to 202f in FIG. 2 indicate the direction of the supporting forces. The carrier 101, which includes the carrier shell 102 and tow frame 104 shown in FIG. 1A, may be towed from a vehicle (not shown) by a tow cable 103. The carrier 101 supports the base assembly 106 therein via linkage 105. More specifically, in the example of FIGS. 1A to 1D, the tow frame 104 of the carrier 101 supports the base assembly via the linkage 105. In apparatus 100 shown in FIGS. 1A to 1D, the linkage 105 comprises the cable isolation system 123 shown in FIG. 1B. However, other linkage systems may be used. The base assembly 106 supports the spherical bearing 110, which in turn supports the bottom-weighted instrument platform 108.

In some embodiments (such as gravity measurement systems), the base assembly may comprise a 3-axis motion compensated platform. For example, such systems may be mounted in an aircraft.

The instrument platform 108 may comprise a lattice or truss, sheet or plate-like surfaces, or combinations thereof.

As mentioned above, at least one vector component sensor 146 is fixed to the instrument platform 108. The at least one sensor 146 in this embodiment includes one or more vector component EM sensors. The EM sensors may or may not be gradiometer-type EM sensors. While examples described herein refer to EM sensors, it is to be understood that embodiments are not limited to use with EM sensors, and other types of vector component sensors may be mounted on an instrument platform in other embodiments. In other embodiments, the sensors 146 may include one or more gravity sensors, which also may or may not be gradiometer-type gravity sensors. Other types of gradiometer vector component sensors may also be used. Embodiments are not limited to acquisition of a particular data type.

Embodiments are not limited to the particular example structure shown in FIGS. 1A to 1C. For example, the instrument platform may have a number of different forms.

In some embodiments, the instrument platform is substantially oblate. For example, the instrument platform may be approximately disc-shaped. If oblate, distal parts of the instrument platform may extend laterally from the spherical bearing. In other embodiments, the instrument platform is substantially prolate. In this case, the distal parts of the instrument platform may lie substantially above and below the spherical bearing.

The instrument platform may comprise a structure for mounting the one or more EM sensors used to acquire the EM survey data, and may bear the electronics and ancillary sensors necessary for data acquisition and subsequent processing. In some embodiments, the instrument platform is rigid. The instrument platform may have a high moment of inertia. The spherical bearing may be the only contact point between the base assembly and the instrument platform. The instrument platform rotates on the spherical bearing about a single point, namely a "center of rotation".

EM sensor data may be continuously acquired provided the limits of the instrument platform's angular motion about the spherical bearing are not reached. In this way, the at least one EM sensor mounted on the instrument platform may be substantially decoupled from the vibrational motion of the carrier, which may pitch and roll around it.

Figure 3:
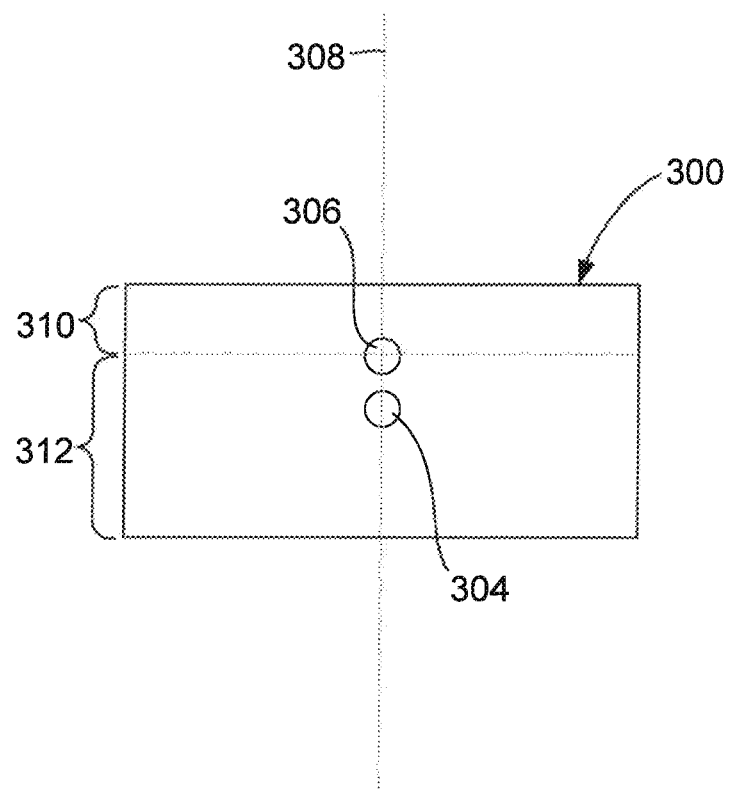
FIG. 3 is a schematic illustration of a bottom-weighted instrument platform according to some embodiments.

FIG. 3 is a side view schematic diagram of an example instrument platform 300 according to some embodiments. The rectangular profile shown in FIG. 3 is not meant to necessarily be representative of the actual shape of the instrument platform 300. Rather, FIG. 3 is simply to illustrate the bottom-weighted nature of the instrument platform 300. For example, the instrument platform 300 in FIG. 3 may have the structure and shape of the instrument platform 108 shown in FIGS. 1A to 1C.

The instrument platform 300 has a center of mass 304 and a center of rotation 306. The center of rotation 306 is the point at which the instrument platform 300 will rotate about a spherical bearing (such as spherical bearing 110 in FIG. 1C) when mounted. FIG. 3 shows the relationship between the center of mass 304 and the center of rotation 306 for of the instrument platform 300. More specifically, the instrument platform 300 is bottom weighted. In the bottom-weighted instrument platform 300, the center of mass 304 is disposed below the center of rotation 306, with the support being provided by the spherical bearing (not shown). A principal axis 308 of the instrument platform 300 may be defined to be the axis that extends through the center of rotation 306 and center of mass 304. According to some embodiments, the instrument platform 300 comprises an upper part 310, located above the center of rotation 306, and a lower part 312 located below the center of rotation 306.

The schematic view of FIG. 3 is not meant to be representative the actual shape of the instrument platform 300, but rather to illustrate the relationship of the center of mass 304 and the center of rotation 306. The actual shape of the instrument platform 300 may vary. The upper part 310 may, for example, be in the form of a stem and the lower part may be generally conical. Other shapes (oblate, prolate, etc.) are also possible. Bottom weighting of the instrument platform may be accomplished in various ways. For example, the dimensions, materials, and shape of the lower and upper parts 312 and 310 may be designed to provide the bottom-weighting. For example, in comparison to a center-weighted instrument platform (where the centre of mass and the centre of rotation are co-located), the lower part 312 of the instrument platform 300 may be larger, made of heavier material, thicker, or otherwise weighted to provide the lower center of mass for the instrument platform 300. Embodiments are not limited to any particular method of bottom-weighting the instrument platform.

The instrument platform 300 may be balanced with its principal axis 308 vertical when it is not in motion.

Forces acting on the bottom weighted instrument platform 300 may produce imbalance torque since the center of mass 304 is offset from the center of rotation 306. The imbalance torque may comprise a gravitational restoring torque as well as "motion torques" resulting from vibrations of the spherical bearing caused by carrier motions. Pendular motion noise may result from the periodic motion of the instrument platform caused by the gravitational restoring torque. Wobble motion noise may result from accelerations of the spherical bearing that are caused by carrier vibrations. When these accelerations are perpendicular to principal axis 308, torque may act on the instrument platform 300, causing it to rotate and inducing angular motion. Collectively, pendular motion noise and wobble motion noise are referred to as imbalance noise. Although bottom weighting may cause imbalance noise, a substantial amount of the imbalance noise may be removed from the EM data, or may be of such a low amplitude as to be inconsequential.

When the instrument platform 300 is in an upright position with its center of mass 304 directly below the center of rotation 306, gravitational forces will act through the center of rotation, and the gravitational restoring torque will be absent.

As the instrument platform tilts, the gravitational restoring torque may oppose its rotational motion as it tips or rotates away from the upright position. The gravitational restoring torque may prevent or delay the instrument platform from reaching the limits of its rotational range around the center of rotation.

Bottom-weighting may extend the acquisition times beyond what can be obtained from a center-balanced instrument platform, possibly without tethers, actuators or other active orientation control systems and the noise those systems may cause.

The characteristics of pendular motion noise and wobble motion noise may be predicted from the inertial properties of the instrument platform 300. The instrument platform 300 may be characterized with moments of inertia, lh and lz about the horizontal axis and the principal (or vertical) axis 308, a mass m, and a distance, L, between the center of mass 304 and the center of rotation 306 about which it rotates. Since the center of mass is located below the center of rotation, the instrument platform may freely pendulate on the spherical bearing with a natural frequency $F=1/(2*pi)*sqrt((m*g*L)/lh)$. By use of a suitably low degree of imbalance (m*L) and a high moment of inertia lh, the natural frequency of its pendular motion noise may lie well below the acquisition band of the EM sensors. Thus, the instrument platform may be configured to have a pendular frequency that suppresses motion noise within an acquisition band of the vector component sensor(s) on the instrument platform. In this context, the verb "suppress" does not mean that motion noise is necessarily eliminated or negligible, but rather that the motion noise of the bottom-weighted instrument platform is reduced or lowered by the bottom weighted platform.

Figure 4A:
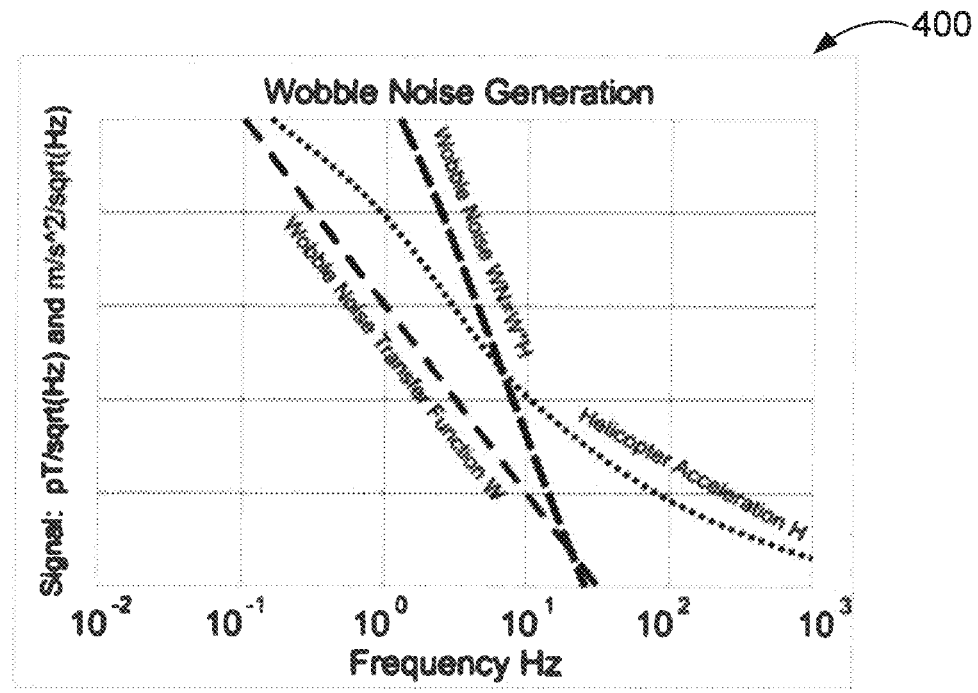
FIG. 4A is a chart illustrating wobble noise generation.
Figure 4B:
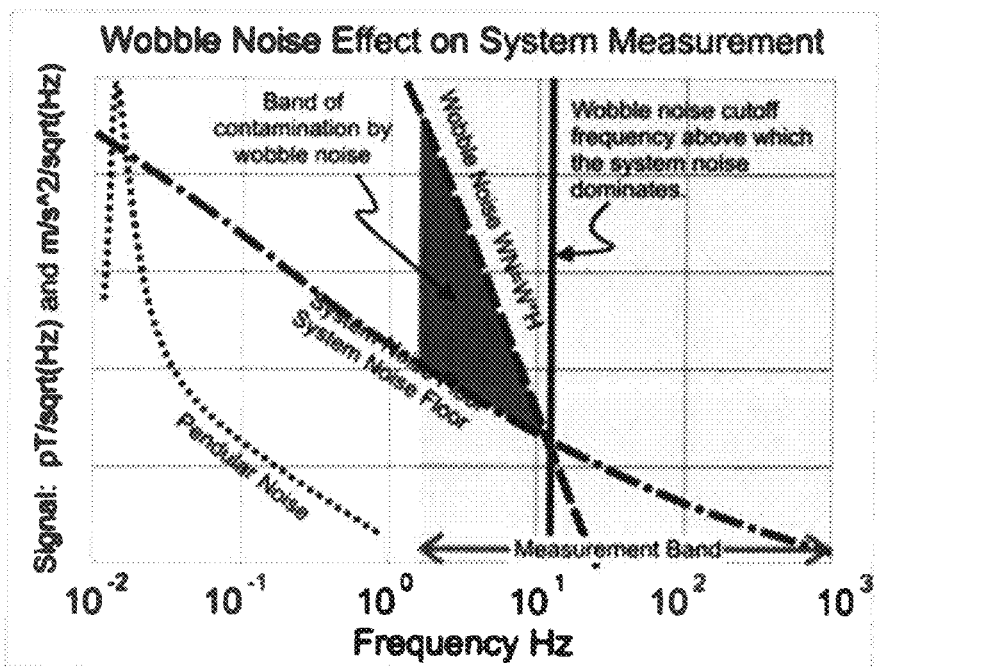
FIG. 4B is a chart illustrating effects of wobble noise on measurement.

FIGS. 4A and 4B are charts 400 and 410 respectively that show how wobble noise may be created and how it may manifest itself. For harmonic accelerations of amplitude a0 perpendicular to the principal axis (e.g. principal axis 308 in FIG. 3), and frequency f, the time dependence may be specified by $a0*sin(2*pi*f*t)$. The harmonic wobble noise may be given by the multiplication of the acceleration, a0 and the wobble noise transfer function, W, may be written as W=a0*Wt where Wt=m*L/(4lh*pi^2*f^2). The chart 400 of FIG. 4A shows wobble noise as the product of the acceleration and the wobble noise transfer function. Shown is the shape of an acceleration spectrum typical of an airborne carrier. The wobble noise plotted in FIG. 4A has a significantly steeper falloff with increasing frequency as compared to the acceleration itself.

The chart 410 of FIG. 4B shows how the wobble and pendular noise may affect the measured EM data. The EM data is desired over a particular measurement band that is shown in light gray. Even in a vibration-free and stationary environment, the EM system has a noise floor caused by electronics and other sources. This noise floor typically slopes moderately to the right on a log-log plot as shown by the dashed-dotted line. The frequency of the pendular motion may be selected so the pendular noise (dotted line) is much smaller than the noise floor within the measurement band. The wobble noise (dashed line) has a much steeper slope than the system noise floor, which it crosses at the "wobble noise cutoff frequency" (solid vertical line). For frequencies, above this cut-off frequency, measurement noise may be dominated by the system noise and the wobble noise may not significantly contribute. If the cutoff frequency is higher than the lower limit of the measurement band, there will exist a band of signal between the two where the signal is contaminated by wobble noise. Where such in-band wobble noise is present, it may be predicted by measuring accelerations of the spherical bearing. The predicted wobble noise may then be subtracted or otherwise removed from the measured data to yield an improved wobble noise-free estimate of the EM data.

In practice, EM sensors may have a sensitivity to signals at frequencies lower than their measurement band. In such cases, low frequency imbalance noise may be superimposed on the signal that an EM sensor responds to. For example, data that are acquired for periods longer than the natural period of the pendular motion of the instrument platform may contain a slowly varying sinusoidal signal caused by the orientation change of the EM sensors in the Earth's magnetic field. Low frequency noise may be separated from the in-band signal with a number of techniques. For example, such low frequency noise may be removed with compensation techniques as disclosed by West et al in WO2014/146184 (A1). Filtering methods known in the state of the art may also be employed to separate out of band, low-frequency noise from the in-band EM signal.

The following characteristics may ensure that good quality electromagnetic data with low imbalance noise is acquired:
i. is the amplitude of the pendular motion noise is small enough to be accommodated by the dynamic range of the EM sensor,
ii. the frequency of the pendular motion noise is low enough that it lies outside the desired acquisition band, permitting the imbalance noise caused by pendular motion to be removed by filtering,
iii. wobble noise signals caused by torques on the bottom weighted instrument platform that may be induced from lateral accelerations of the spherical bearing are acceptably low, and
iv. wobble noise signals may be computed and subtracted from the EM sensor signal.

With reference again to FIG. 2, wobble noise may be further diminished if the linkage 105 that connects the base assembly 106 to the carrier 101 comprises vibration damping components such as bungees, cables, dampers, springs or pneumatic elements. Such a vibration damping linkage 105 may reduce vibrations transmitted through it from the carrier 101, and so may dampen the vibrations of spherical bearing 110. In so doing, motion torques acting on the instrument platform 108 may be reduced, with imbalance noise reduced accordingly. The function of a vibration damping linkage 206 may be to attenuate the acceleration spectrum shown in FIG. 4A, thereby reducing the wobble noise. In addition to lowering the noise in an EM measurement, a reduction in wobble noise would then advantageously lower the wobble noise cutoff frequency shown in FIG. 4B.

Imbalance noise results from the center of mass being offset from the center of rotation provided by the spherical bearing. A function of spherical bearing 110 according to some embodiments is to transfer the weight of instrument platform 108 to base assembly 106, while permitting low friction or substantially frictionless rotation of the instrument platform in any angular direction. The term spherical is not meant to describe or limit the shape of the bearing, but describes the range of angular motions achievable by the bearing. Spherically shaped bearings, such as spherical air bearings, or sharp or small rounded tips, may achieve the desired range of rotational motion. The spherical bearing provides the instrument platform with a single center of rotation. The spherical bearing may rotationally decouple the motion of the base assembly from the instrument platform about three independent axes. A spherical bearing may permit unlimited rotation about the principal axis of the instrument platform 108, while also permitting rotation within a limiting tilt angle about axes orthogonal to the principal axes, subject to the angular disposition and constraints of the instrument platform and the constraints of the spherical bearing itself.

FIGS. 5A to 5D illustrate four examples of possible configurations for the spherical bearings that may be used as the spherical bearing 110 in the apparatus 100 of FIGS. 1A to 1D.

Figure 5A:
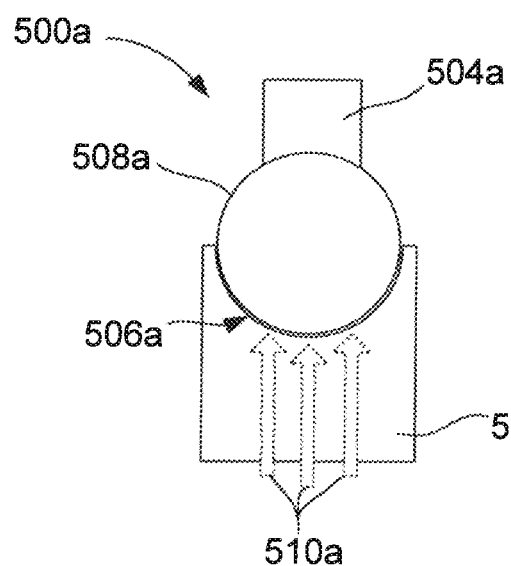
FIGS. 5A to 5D show various exemplary configurations of a spherical bearing according to some embodiments.

FIG. 5A is a side cross sectional view of a spherical air bearing 500a according to one embodiment. The spherical bearing 500a includes a first part 502a and a second part 504a. The first part 502a may be affixed to the base assembly (such as the pedestal 144 of base assembly 106 in FIG. 1C). The second part 504a may be affixed to the instrument platform (such as the instrument platform 108 or 300 in FIGS. 1A to 1C and 3). The first part 502a comprises a seat 506a in this embodiment. The second part 504a comprises a protruding part 508a that mates with the seat 506a. The seat 506a in this embodiment is a concave spherical seat and the protruding part 508a is spherical and fits into the concave spherical seat 506a. Arrows 510a indicating the upward direction of air flow from the base assembly into the spherical air bearing 500a. The spherical protruding part 508a may rotate within the conforming spherical seat 506a, separated from it by a cushion of air. This type of spherical air bearing may be preferable for supporting the mass of an instrument platform. However, embodiments are not limited to any particular bearing type.

Figure 5B:
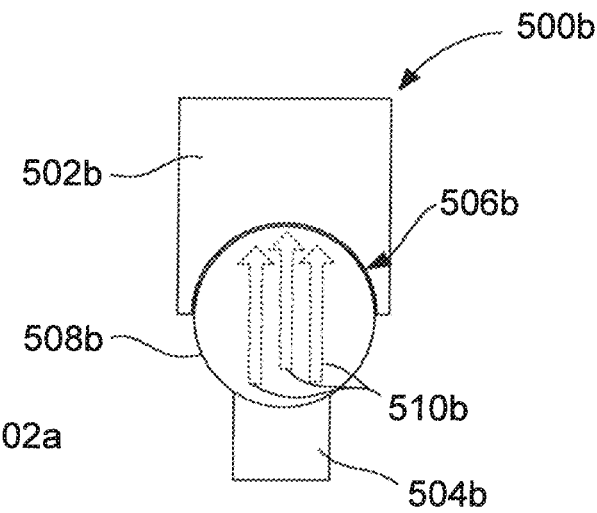

FIG. 5B is a side cross sectional view of a spherical air bearing 500b according to another embodiment. The spherical bearing 500b includes a first part 502b and a second part 504b. The first part 502b may be affixed to the instrument platform (such as the instrument platform 108 or 300 in FIGS. 1A to 1C and 3). This spherical air bearing 500b is structurally similar to the spherical bearing 500a in FIG. 5A, but vertically reversed. Arrows 510b indicating the upward direction of air flow from the base assembly into the spherical air bearing 500b.

Figure 5C:
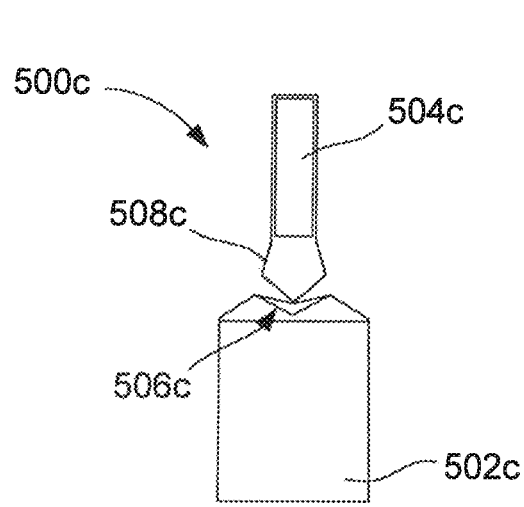

FIG. 5C is a side cross sectional view of a spherical bearing 500c according to another embodiment. The spherical bearing 500c includes a first part 502c that may be affixed to a base assembly and a second part 504c that may be affixed to an instrument platform. In this embodiment, the first part 502c comprises an anvil seat 506c. The second part 504c comprises a rigid, tip-shaped protruding part 508c that mates with the anvil seat 506c. The tip-shaped protruding part 508c may roll within the anvil seat 506c.

Figure 5D:
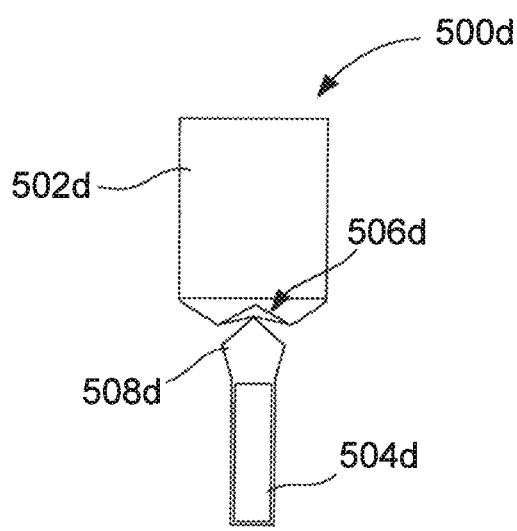

FIG. 5D is a side cross sectional view of a spherical bearing 500d according to another embodiment. The spherical bearing 500d includes a first part 502d that may be affixed to an instrument platform and a second part 504d that may be affixed to a base assembly. This spherical bearing 500d is structurally similar to the spherical bearing 500c in FIG. 5C, but vertically reversed. The examples of FIG. 5C and 5D may be used, for example, with smaller, lighter instrument platforms such as an instrument platform having one or more MEMS sensors. However, the examples of FIGS. 5C and 5D are not limited to such uses.

Persons skilled in the art may appreciate that the cases illustrated in FIG. 5A to 5D are meant to be exemplary and not limiting and that many spherical bearing configurations that achieve a similar effect while allowing required range of low friction or nearly frictionless rotational motion are possible.

Since aspects of the disclosure may be used to acquire electromagnetic or other survey data from a moving carrier, the instrument platform may be latched or otherwise tethered to the carrier or base assembly for transport or ferrying to a survey location. Accordingly, some embodiments may comprise a latching system to hold the instrument platform in a fixed position relative to the base assembly as it is being ferried. When survey data are to be acquired, the instrument platform may be released or unlatched to rotate independently of the carrier. As the instrument platform is released, it may retain the angular velocity that it acquired during its latched or tethered state. In such cases, the instrument platform must be righted so that its principal axis is substantially vertical, and disposed with a small or zero angular velocity.

Some embodiments may also comprise a righting system to adjust the orientation as well as the angular velocity of the instrument platform. When data acquisition begins, it may be advantageous to dispose the instrument platform (e.g. instrument platform 108 and 300 of FIGS. 1A to 1C and 3) with an orientation such that its principal axis (e.g. axis 308 in FIG. 3) is substantially upright, as this may dispose the instrument platform to an orientation that is as far away from its limits of angular motion as possible with no gravitational potential energy. Doing so may maximize the duration over which a measurement may be acquired before the limits of angular motion are reached. It may also be advantageous to ensure the instrument platform has a small or zero angular velocity, as this may also maximize the duration over which a measurement may be acquired before the limits of angular motion are reached. When the righting system disposes the instrument platform with a small or zero angular velocity and a substantially upright principal axis, EM or other vector component survey data may be acquired with minimal motion noise for a maximum duration.

The righting system may be disposed on the instrument platform, and may comprise thrusters or a moveable mass which may adjust the gravitational torque acting on the platform. The righting system may dispose the instrument platform to a substantially upright position with its angular velocity substantially nulled. A righting system may also be operated intermittently to right the instrument platform should a limit of tilt angular motion be reached. A righting system may also brake the rotation of the instrument platform to reduce its angular velocity.

As previously noted, since the instrument platform may be mounted on a single spherical bearing with its center of mass offset from the center of rotation, vibrations of the spherical bearing may cause torque on the instrument platform. This torque may cause the instrument platform to rotate, and these rotations may cause wobble noise. Knowing the accelerations of the spherical bearing and the inertial properties of the instrument platform, the rotations and hence the wobble noise may be computed. The wobble noise may then be subtracted from the measured EM data to yield EM data corrected for wobble noise effects.

Figure 6A:
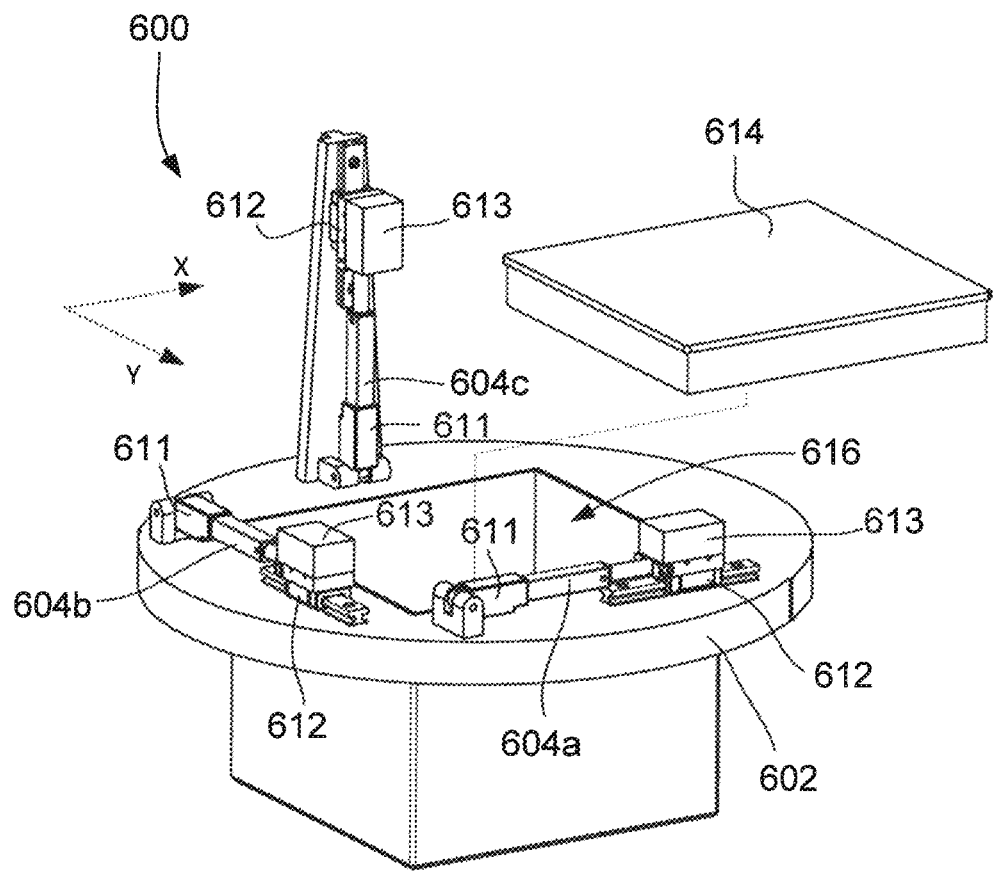
FIG. 6A is a perspective view of an example righting system according to some embodiments.

FIG. 6A is a perspective view of an example righting system 600 according to some embodiments. The righting system 600 is shown on a disk-shaped cap 602 that comprises the top side of cylindrical upper part of the instrument platform (e.g. the stem 159 of the upper portion 154 of the instrument platform 108 in FIG. 1C), The righting system 600 in this example comprises first, second and third moveable mass assemblies 604a, 604b and 604c. More or fewer movable mass assemblies may be used in other embodiments. Each moveable mass assembly 604a, 604b and 604c is comprised of a respective linear motor 611, a track 612 and a mass 613. In this example embodiment, the upper cap 602 includes an optional electronics bay 616 and an access cover 614 that fits over electronics bay 616. The first and second moveable mass assemblies 604a and 604b are configured to move their masses 613 in the generally horizontal x and y directions respectively so as to adjust the righting torques in the y and x directions. The third moveable mass assembly 604c allows the degree of bottom weighting and hence the natural frequency of the instrument platform to be adjusted.

Figure 6B:
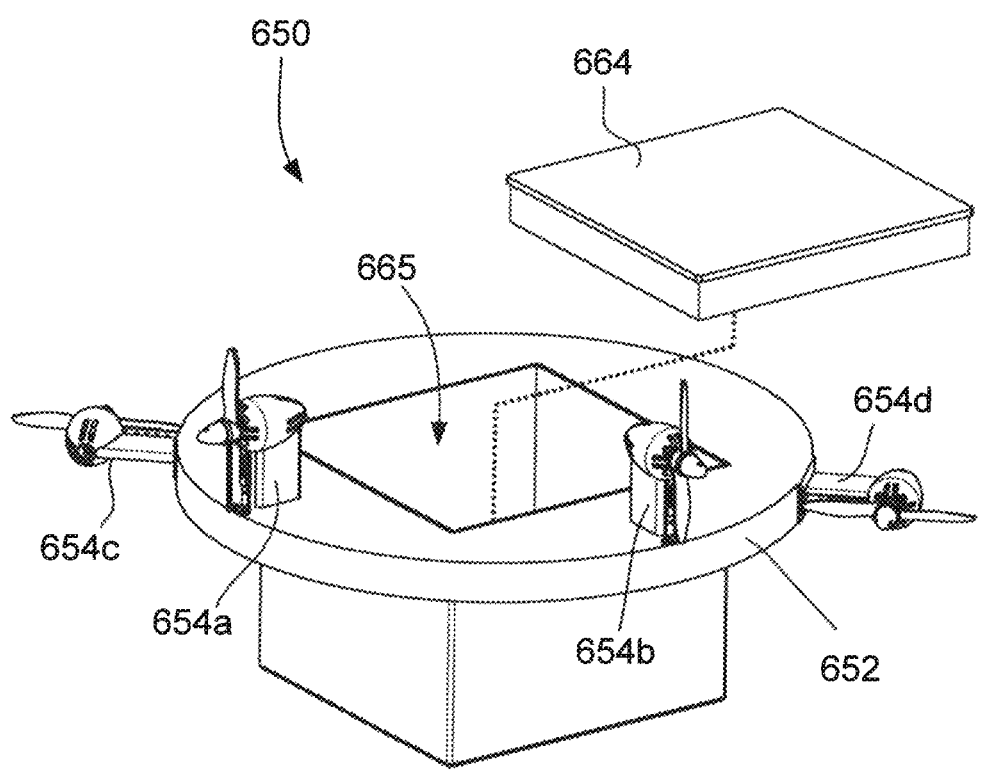
FIG. 6B is a perspective view of another example righting system according to some embodiments.

FIG. 6B is a perspective view of another example righting system 650 according to some embodiments. The righting system 650 in this example comprises first, second, third and fourth thrusters 654a, 654b, 654c, and 654d. More or fewer movable thrusters may be used in other embodiments. The thrusters 654a, 654b, 654c, and 654d in this example are reversible fans. The thrusters 654a, 654b, 654c, and 654d in this embodiment are mounted on disk-shaped cap 652 that comprises the top side of cylindrical upper part of the instrument platform (e.g. the stem 159 of the upper portion 154 of the instrument platform 108 in FIG. 1C). In this embodiment, first and second reversible fans 654a and 654b are arranged to apply torque about a respective horizontal axis of rotation through the spherical bearing. Third and fourth reversible fans 654c and 654d are arranged to apply torque through the spherical bearing about the principal axis of the instrument platform (e.g. axis 308, illustrated in FIG. 3). In this example embodiment, the upper cap 602 includes an optional electronics bay 665 and an access cover 664 that fits over electronics bay 665.

In some embodiments, accelerations of the spherical bearing are measured by one or more accelerometers. For example, acceleration may be measured by a high precision-three component accelerometer 164 shown in FIG. 1C. The one or more accelerometers may be disposed on the instrument platform (e.g. instrument platform 108 of FIGS. 1A to 1C) proximate to the spherical bearing (e.g. spherical bearing 110 in FIGS. 1A to 1C) so that any Coriolis or centripetal rotational forces it may sense due to the rotation of the instrument platform about the spherical bearing are minor. A direct mathematical relationship, such as a transfer function, Wt, may be found between the input acceleration data, measured by the three-component accelerometer, and the angular motion of the instrument platform driven by the resulting torques. Transfer function, Wt, may have the form $$i. Wt=m*L/(4*lh*pi\^2*f\^2).$$

Other mathematical relations between acceleration and angular motion, such as a neural networks, fuzzy logic, look-up tables, predictive filtering, least squares or other model fitting methods are known and may also be implemented in some embodiments.

A vector component fluxgate magnetometer, gyros, a GPS and other related devices may be deployed on the instrument platform. These instruments may measure the static magnetic field of the Earth in the frame of the instrument platform, and may sense the orientation, motion and location of the instrument platform in the frame of the Earth. Sensor data may be saved to a controller located on the instrument platform, or it may be wirelessly transferred to a controller or data recorder located in the proximity of the instrument platform, such as in the carrier. Inputs from these instruments and sensors may also be used to control operation of latching and/or righting systems.

Some embodiments include or connect to a compressed air system to provide compressed air to one or more pneumatic components. As mentioned above, the spherical bearing may be an air bearing, and the compressed air system may provide air to the bearing. The linkage between the carrier and the base assembly may also include vibration-suppressing pneumatic elements that receives compressed air from the compressed air system. Other pneumatic elements may also be included. The compressed air system may comprise an air pump or air supply tanks, air supply lines, valves, regulators and accumulators or buffering tanks. Embodiments are not limited to any particular compressed air system arrangement, and some embodiments may operate without any compressed air system.

In some embodiments, the apparatus (comprising at least the base assembly, spherical bearing, bottom-weighted instrument platform and sensors) is borne in a carrier configured for airborne surveys. The carrier may be a "bird" or a "sonde" towed from an aircraft, typically a helicopter, using a tow cable that may range from 30 to 90 meters in length. The carrier may be shaped to minimize drag resistance at tow speeds of 25 to 30 meters/second. The towed bird may contain a cavity into which the base assembly, spherical bearing and instrument platform described herein may be fitted.

Figure 7:
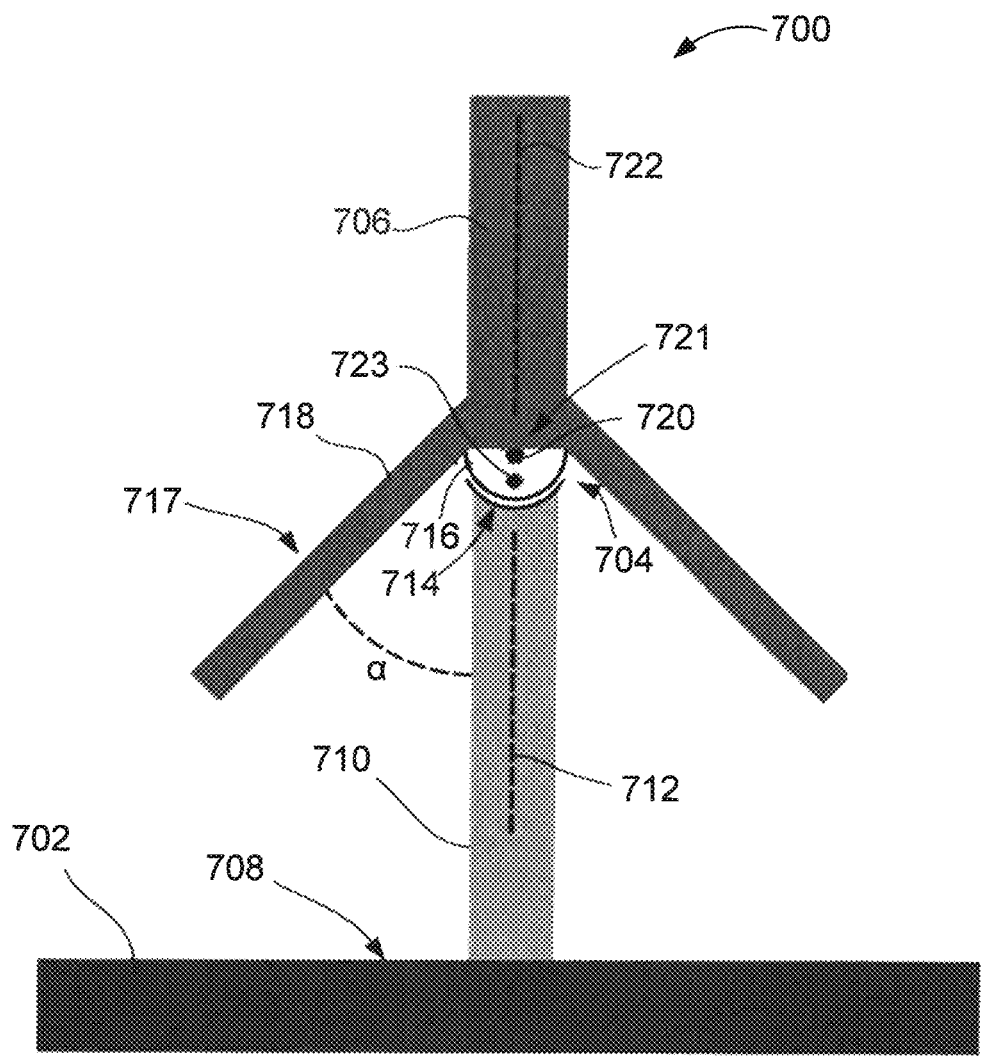
FIG. 7 is a cross-sectional side view diagram of an apparatus for data acquisition according to some embodiments.

FIG. 7 is a cross-sectional schematic view of an apparatus 700 for data acquisition according to some embodiments. The apparatus 700 includes a base assembly 702, a spherical bearing 704 and an instrument platform 706. The spherical bearing 704 is mounted to the base assembly 702, and the instrument platform 706 is mounted on and supported by the spherical bearing 704. The spherical bearing 704 provides free angular rotation of the instrument platform 706 within a tilt angle range about the spherical bearing 704. The instrument platform 706 is bottom-weighted similar to the instrument platform 300 shown in FIG. 3 (i.e. a center of mass 723 of the instrument platform 706 is disposed below its center of rotation 720).

The base assembly 702 in this embodiment comprises a main base portion 708 and a pedestal in the form of a post 710 which securely affixed to and extends upward from the main base portion 708. Post 710 extends upwardly along post axis 712. The spherical bearing 704 comprises a seat part 714 affixed to the top of the post 710. The spherical bearing 704 is an air bearing with protruding part 716 affixed to instrument platform 706 (similar to the air bearing 500a of FIG. 5A).

The instrument platform 706 of FIG. 7 is a body comprising a lower part 717 disposed generally below its center of rotation 720. The lower part 717 is in the form of a conical, downward facing skirt 718 that defines a downward facing, open aperture with spherical bearing 704 disposed at its apex 721. The center of mass of the instrument platform 706 is a distance below the apex 721. This arrangement of conical skirt 718 and post 710 may permit the principal axis 722 of instrument platform 706 to rotate on the spherical bearing 704 away from post axis 712 within the range of the limiting tilt angle α shown in FIG. 7. More specifically, the aperture formed by conical skirt 718 provides clearance about the spherical bearing and base assembly to allow the instrument platform a range of tilt rotation within the tilt angle range. Permitted rotation in the orthogonal directions to the principal axis 722 may be more or less than limiting angle α of FIG. 7 according to the opening angle of the conical skirt 718 and/or the angular range of motion permitted by the spherical bearing 704. Embodiments are not limited to a particular range of rotation.

In some embodiments, one vector component EM sensor (such as sensor 146 shown in FIGS. 1A to 1C) is securely affixed to the bottom-weighted instrument platform 706. In another embodiment, three EM sensors, disposed in independent sensing orientations, are securely affixed to the bottom-weighted instrument platform 706.

In some embodiments, the instrument platform described herein is constructed from a rigid and/or resistive composite material.

Figure 8:
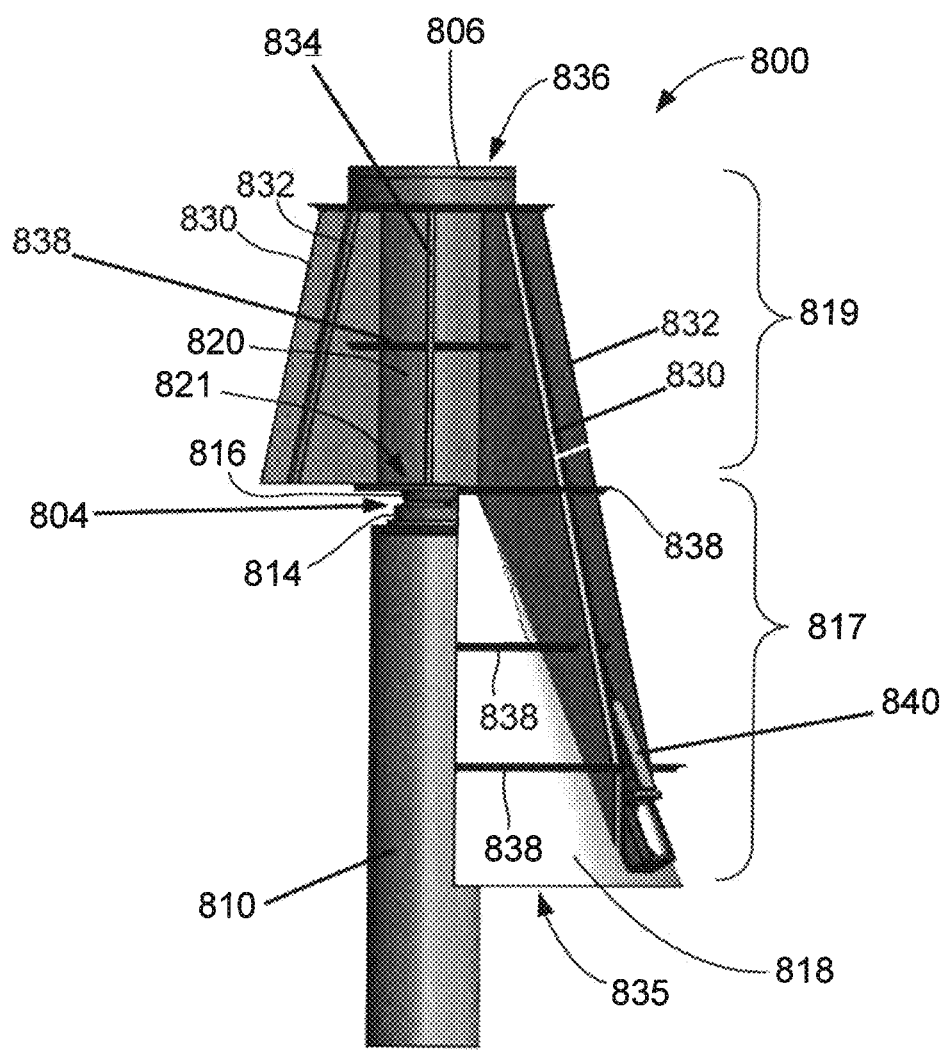
FIG. 8 is a partial cutaway side view of an example instrument platform mounted on a post by a spherical bearing according to another embodiment.
Figure 9:
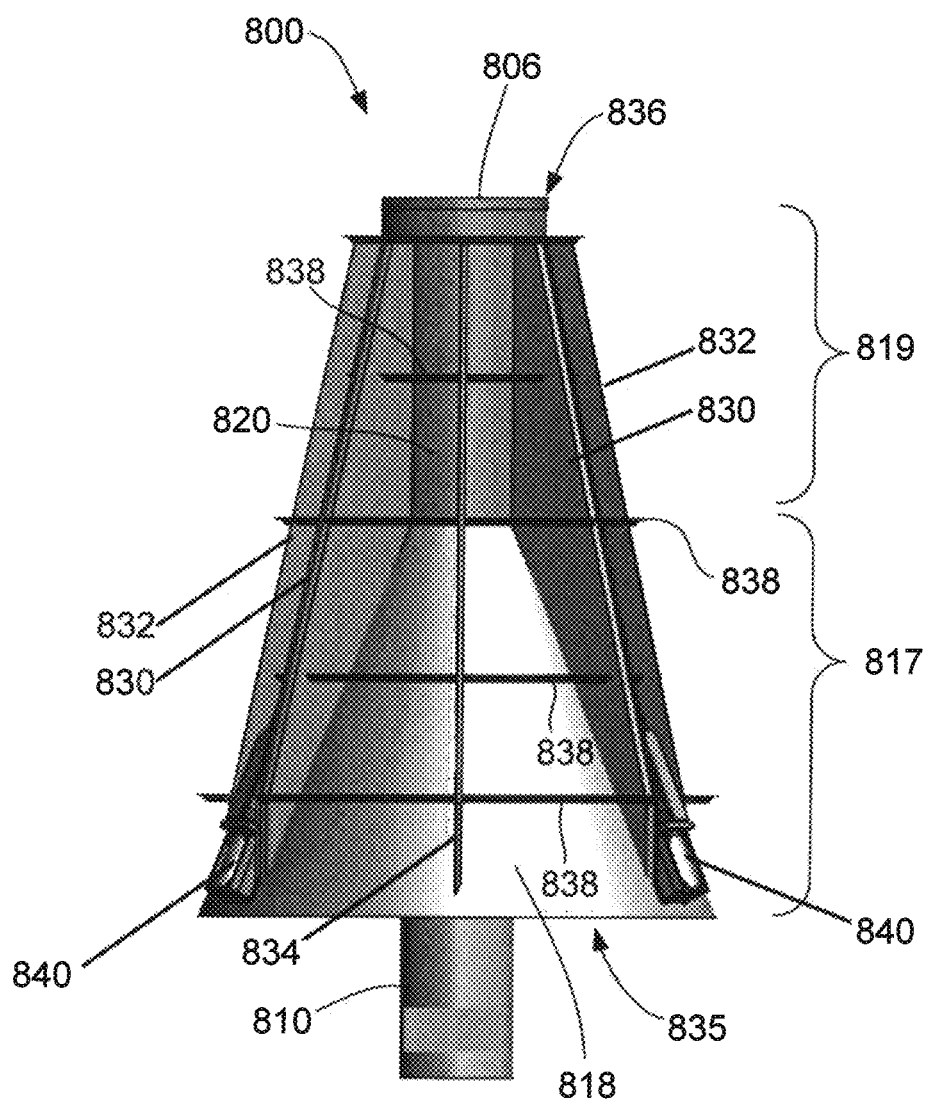
FIG. 9 is a side view of the instrument platform and post of FIG. 8.

FIGS. 8 and 9 illustrate an example instrument platform 800 for airborne data acquisition according to another embodiment. In FIG. 8, the instrument platform 800 is partially cutaway so that pedestal in the form of post 810 and spherical bearing 804 are visible. The instrument platform 800 is mounted on said post 810 by the spherical bearing 804 similar to other embodiments described hererin. The instrument platform 800 comprises platform body 806 comprising a lower portion 817 that includes a conical skirt 818 that forms a downward facing open conical aperture and an upper portion 819 that includes a cylindrical stem 820. In this embodiment, the spherical bearing 804 is a spherical air bearing with a seat part 814 and a protruding part 816. The post 810 may extend upwardly from a main portion of a base assembly (such as the base assembly 106 in FIGS. 1A to 1C or base portion 702 in FIG. 7). The protruding part 816 of the air bearing 814 is affixed to and disposed downwardly from the apex 821 of the conical skirt 818, with the seat part 814 securely affixed to the top of post 810. The downward facing conical skirt 818 is disposed to allow the instrument platform 800 a range of tilt rotation within the limiting tilt angle of the instrument platform 800 and the spherical bearing 804.

In this embodiment, instrument platform 800 resembles an inverted funnel supported by the air bearing from the apex 821 of the funnel's conical skirt 818, with the cylindrical stem 820 extending upwardly from the apex. The center of mass of the instrument platform 800 is disposed a distance below the apex 821, and below the centre of rotation about the cylindrical bearing (not shown in FIG. 8). Three pairs of longitudinal, fin-like support members 830 and 832 are disposed about circumference of the instrument platform when viewed from above, and stiffen the instrument platform along the longitudinal sections where, in this embodiment, the vector component EM sensors 840 are mounted. The paired members 830 and 832 may be affixed longitudinally along the outer sides of instrument platform 800. Additional support longitudinal members 834 are spaced midway between the paired longitudinal members 830 and 832 to reduce deformations of the platform between the EM sensors 840. Members 834 contribute to the rigidity of the instrument platform by maintaining stable relative direction cosines between the sensing directions of EM sensors, and so limit the motion noise that may be associated with platform deformations. These support members 830, 832 and 834 extend from the distal end 835 of the conical skirt 818 to the distal end 836 of the stem 820. Together, the longitudinal support members 830, 832 and 834 may reduce the bending strain associated with flexure of the instrument platform about apex 821. The instrument platform 800 in this example also includes lateral support members 838 that are run horizontally between the longitudinal support members 830, 832 and 834. The lateral members 838 are spaced vertically up the sides of the instrument platform 800 and may provide lateral support to the longitudinal members 830, 832 and 834. Embodiments are not limited to this particular shape and structure of this example of instrument platform 800.

In this embodiment, the instrument platform is rigid. Being rigid, motion noise due to angular motions of the vector component sensors induced as a result of deformations of the instrument platform, as it responds to accelerations of the air bearing, may be acceptably low.

In one embodiment, the instrument platform 800 has a mass of 75 kg and bottom weighting, mL, of 0.035 kg-m. The instrument platform 800 may have a natural period of approximately 1 minute and may support three independently oriented EM sensors with a 1 Hz lower acquisition limit. The motion noise associated with a 1 minute pendular motion of the instrument platform 800 may have an inverse frequency squared dependence above the 1 Hz acquisition limit of the EM sensors and may be easily removed through standard methods known in the art, which may comprise high-pass filtering. In this embodiment, motion noise of the carrier may be effectively suppressed through the inertial qualities of the instrument platform 800, leaving residual motion noise with favourable frequency dependence.

Figure 10:
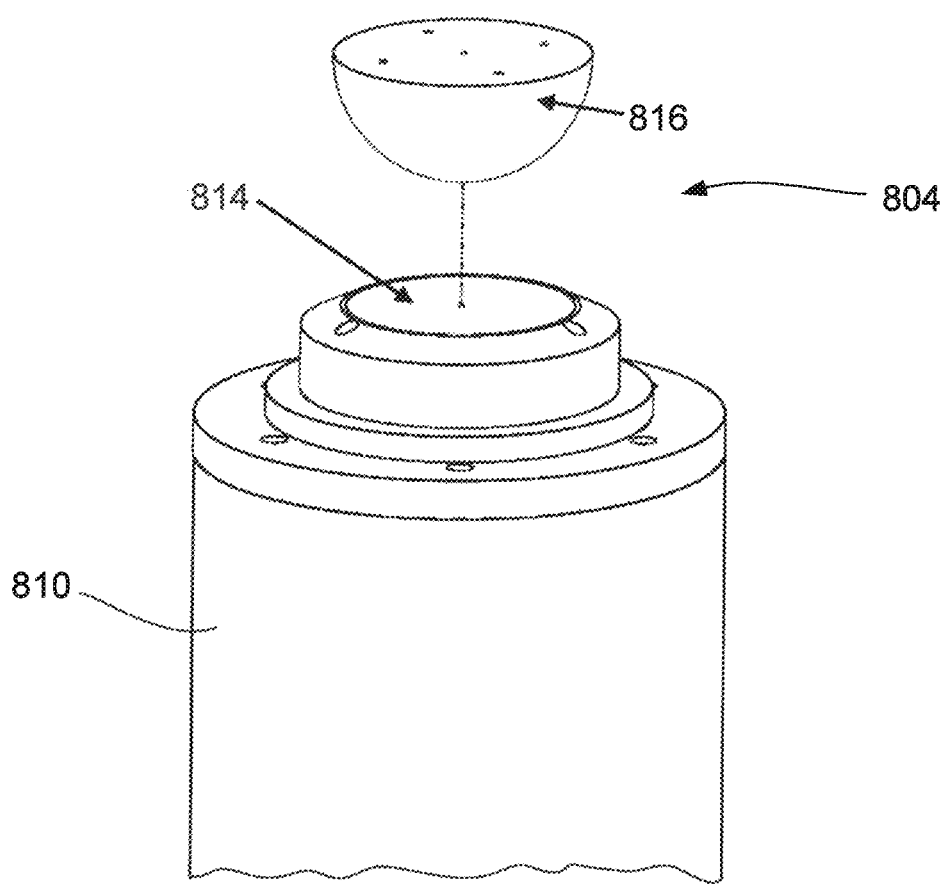
FIG. 10 is an exploded perspective view of the spherical bearing and the post of FIG. 8.

FIG. 10 is a partial perspective view of the post 810 and spherical bearing 804 in FIG. 8. In this example, the spherical bearing 804 is an air bearing, although other spherical bearings may be used in other embodiments. The seat part 814 is concave spherical in shape, and is affixed at the top of post 810 as illustrated in FIG. 10. Compressed air may be vented upwardly through small perforations (not shown) in the seat part 814 into a small gap between it and the convex spherical protruding part 816 (shown in FIG. 9). The resulting air cushion that forms between the seat part 814 and the protruding part 816 of the spherical air bearing 804 may provide a largely low friction or nearly frictionless support and coupling upon which the instrument platform 800 (shown in FIG. 9) may freely rotate with respect to the post 810.

In some embodiments, particularly where the vector component sensors are EM sensors, the spherical air bearing 804 is constructed from a low-magnetic permeability, poorly conducting metal such as titanium. In other embodiments, the spherical air bearing is constructed from a ceramic or other resistive and mechanically competent material. In other embodiments, such as where the vector component sensor are not EM sensors (e.g. gravity sensors), the magnetic permeability and conductivity of the air bearing may have little effect on the sensed field data. Embodiments are not limited to any particular material. If the spherical bearing 804 and the linkage (not shown) to the carrier comprise pneumatic elements, a common pneumatic system may be used to supply the air to the spherical bearing 800 and to the pneumatic elements that comprise the linkage.

Figure 11:
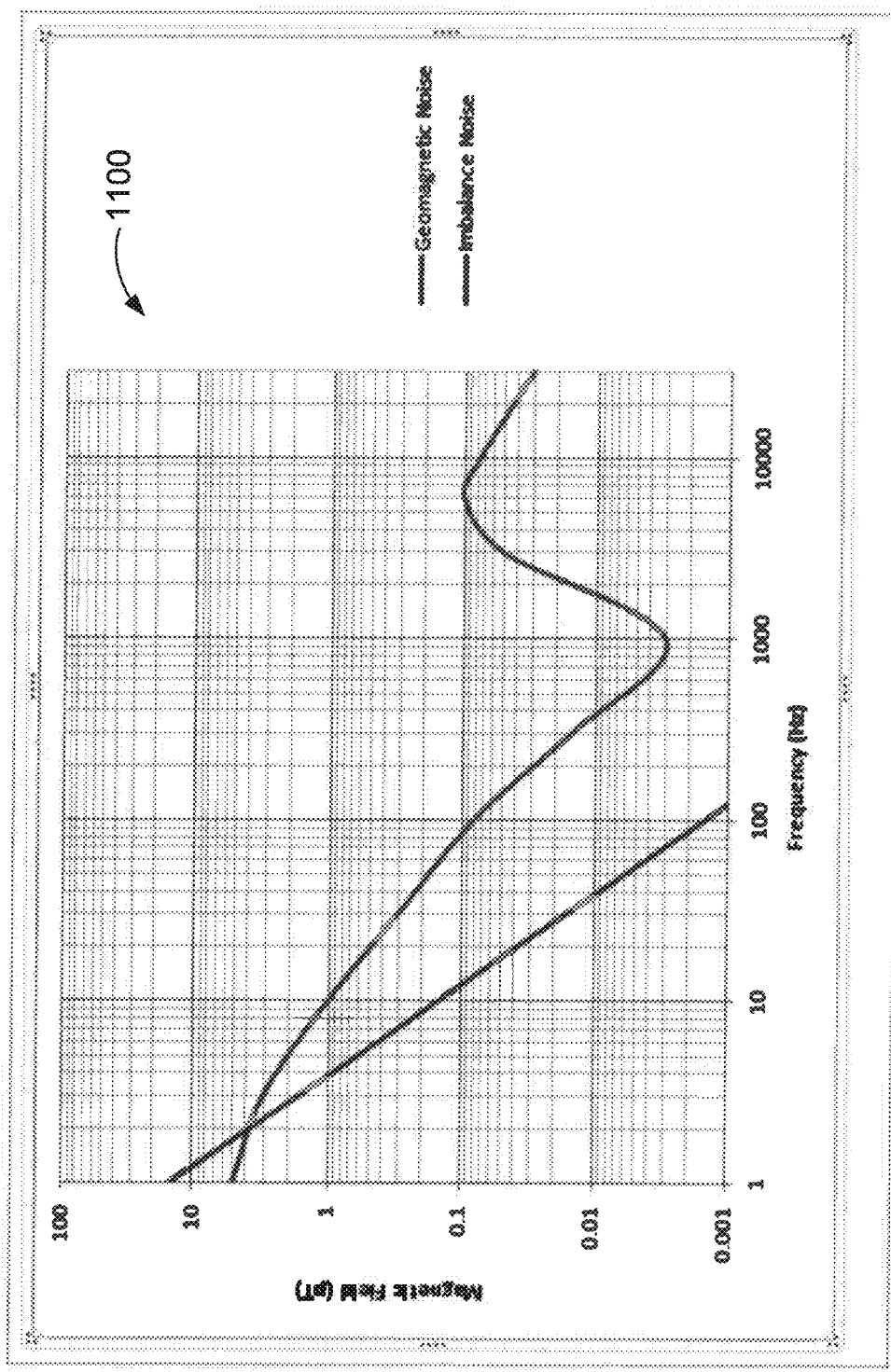
FIG. 11 is a chart showing motion noise and the geomagnetic spectrum as a function of frequency for one example embodiment.

FIG. 11 is a chart 1100 that illustrates the motion noise and the geomagnetic spectrum as a function of frequency, f, for an embodiment with a mass of 75 kg and a bottom weight of 0.035 kg-m. When EM data are acquired, the geomagnetic spectrum is an important benchmark as it represents a noise floor in the case of controlled-source EM measurements and it represents the source signal in the case of natural-source EM measurements. The geomagnetic spectrum generally responds inversely with frequency between 1 Hz and 500 Hz, while wobble noise may respond inversely with the square of frequency in the same range.

The wobble imbalance motion noise shown in FIG. 11 is presented for a lateral acceleration signal that is flat spectrally, using observed accelerations in the 6-15 Hz range, in one embodiment, configured for airborne electromagnetic surveying. The wobble imbalance motion noise may be further lowered by adjusting the frequency response of the linkage between the carrier and the base assembly to reduce accelerations of the base assembly, or by further adjusting the natural frequency of the platform's pendular motion downwards.

Aspects of imbalance motion noise may be adjusted by altering the bottom weighting to the meet the objective of a survey. In natural field EM surveys, EM data may be acquired at frequencies above the lowest Schumann resonance at approximately 8 Hz. For such surveys, the motion noise shown in FIG. 11 is sufficiently low to provide useful estimates of the Earth's conductivity structure. In controlled source surveys, where the EM survey apparatus comprises a transmitter that induces time varying current in the ground, the geomagnetic noise forms the useable noise floor of a measurement, and the motion noise illustrated in FIG. 11 is sufficiently low to acquire useful data down to 2 or 3 Hz.

Turning again to FIGS. 8 and 9, in an embodiment, three EM sensors 840 are each mounted on the platform body 806 between a respective pair of longitudinal support members 830 and 832 on the conical skirt 818 of the instrument platform. The EM sensors 840 are vector component electromagnetic sensors in this example, although other sensor types may be used. The mass of the EM sensors 840 may be offset by the mass of the ancillary equipment and batteries located in the cylinder stem 820 to yield an instrument platform 800 (inclusive of its sensors and ancillary equipment) that is slightly bottom weighted when balanced on the spherical bearing 804.

The EM sensors 840 may each be a feedback magnetometer with an acquisition band extending from 1 Hz to 25 KHz and a noise power spectral density of 1 pT/root-Hz at 1 Hz. The EM sensors 840 are rigidly affixed to the instrument platform in this embodiment. The EM sensors 840 in this example are spaced equally around the circumference of the conical skirt 818 of the instrument platform 800. However, it is to be understood that the number, type and positioning of sensors in other embodiments may vary. Some embodiments may include four or more sensors. Some sensors may be independently oriented. Furthermore, one or more sensors may be swapped or interchanged in some embodiments. In embodiments suitable for natural field electromagnetic surveys, an EM sensor may, for example, operate in an acquisition band between 8 and 700 Hz. In an embodiment suitable for controlled source electromagnetic surveys, the EM sensor may, for example, operate in an acquisition band between 1 and 25,000 Hz and may have a sub-picoTesla noise floor at 1 Hz. In some embodiments, the EM sensor may be a vector component magnetometer.

Figure 12:
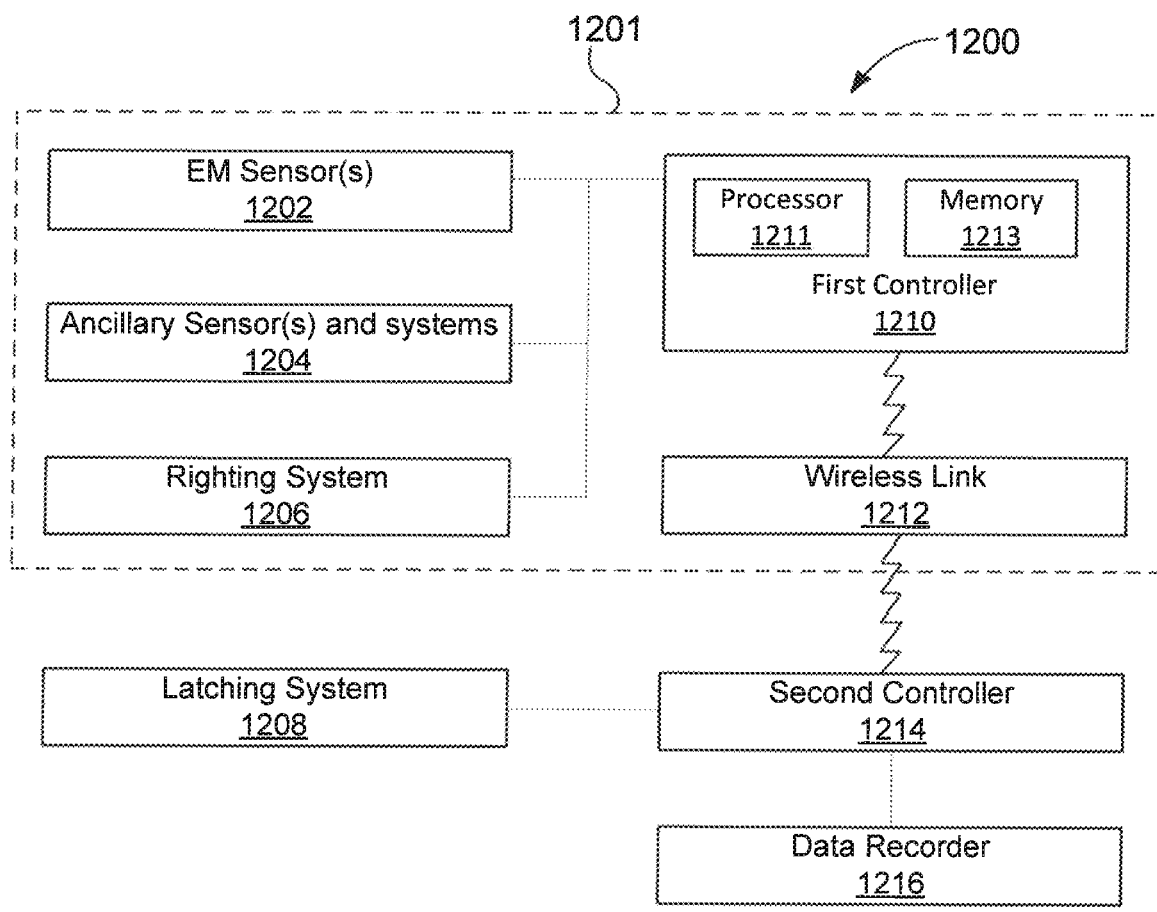
FIG. 12 is a block diagram of a sensor and controller system according to some embodiments.

FIG. 12 is a block diagram of an example sensor system 1200 that may be implemented with an instrument platform 1201. The instrument platform 1201 may be similar to the instrument platforms 108, 300, 706 or 800 in FIGS. 1A to 1C, 3, 8 and 9. The system 1200 in this example includes one or more EM sensors 1202, one or more optional ancillary sensors and systems 1204, a righting system 1206, a latching system 1208, first and second controllers 1210 and 1214, wireless link 1212 and a data recorder 1216. In this example, the EM sensor(s) 1202, the ancillary sensor(s) and systems 1204, the righting system 1206, the first controller 1210 and the wireless link 1212 are mounted on the instrument platform 1201. One or more components may also be located off of the instrument platform. For example, the second controller 1214, the latching system 1208 and the data recorder 1216 are not mounted on the instrument platform in this embodiment. The wireless link 1212 may include wireless communication means such as a wireless transmitter, receiver, transceiver or any suitable combination thereof to implement wireless communication between the first and second controllers 1210 and 1214. In some embodiments, a wireless link may be established directly between the first controller 1210 and the data recorder 1216.

The EM sensor(s) 1202 and ancillary sensor(s) and systems 1204 may be mounted to the instrument platform 1201 in various positions. The ancillary sensor(s) and systems 1204 may be for acquiring electromagnetic survey data. The ancillary sensors and systems 1204 may also comprise attitude measurement means, such as a three-component static-field vector magnetometer, an accelerometer, gyros, tilt and rotation sensors. Ancillary sensors 1204 may further comprise a GPS, Glonass or equivalent sensor.

Knowing the attitude of the instrument platform enables the acquired electromagnetic vector data, or other vector sensor data, to be projected from the local coordinate system of the instrument platform into a global coordinate system.

As shown in FIG. 12, the EM sensor(s) 1202, the ancillary sensor(s) and systems and the righting system 1206 are all connected to and controlled by the first controller 1210. The first and second controllers 1210 and 1214 may each comprise one or more processors and memory. For example, the first controller is shown with processor 1211 and memory 1213 in FIG. 12. The memory 1213 may store instructions thereon for causing the processor 1211 to perform the functionality discussed herein. Other combinations of hardware and software to implement the controllers 1210 and 1214 may be used. The latching system 1208 and data recorder are connected to and controlled by the second controller 1214. The first and second controllers 1210 and 1214 are each in wireless communication via the wireless link 1212. The instrument platform may further support the necessary power supplies and batteries to run the components of the system 1200.

Data acquired by the sensors 1202 and/or 1204 may be stored in a database. The database may comprise memory for storage and retrieval of the data. For example, the first and/or second controllers 1210 and 1214 may cause the received data to be transmitted (e.g. by wireless link 1212) for storage in the database. In the specific example of FIG. 12, the data recorder 1216 comprises said database. Thus, the data acquired by the sensors 1202 and/or 1204 may be uploaded to the second controller 1214 and/or the data recorder 1216 via wireless link 1212. Data may be retrieved from the data recorder 1216 for subsequent processing. In other embodiments, the first controller 1210 may include a database implemented in memory 1213 for storing said data.

With the wireless link 1212 between first controller 1210 to second controller 1214, the instrument platform may be free of any mechanical links or umbilical cords connecting it to the base assembly or the carrier as EM data are being acquired, apart from the contact at the spherical bearing. In an embodiment, no umbilical cords or restraining devices are employed that may impede the free motion of the instrument platform relative to the base assembly. The wireless link 1212 may comprise a wireless transmitter. Alternatively, the transmitter part of wireless link 1212 may be part of the controller 1210 and the controller may provide the wireless link functionality. Embodiments are not limited to a particular hardware arrangement.

Power to the components on the instrument platform 1201 may be supplied by battery or an equivalent power source, such as a fuel cell or super-capacitor. Power leads to the sensors 1202 and/or 1204 may be twisted to minimize stray magnetic fields from the feed currents. All elements supported by the instrument platform 1201 may be securely mounted to minimize or eliminate stray vibrations caused by the relative motion of an element relative to the instrument platform 1201.

Some components carried by the instrument platform 1201 may be housed in an electromagnetically shielded electronics bay (such as bay 170 in FIG. 1C). The shielded electronics bay and the components it contains may form an offsetting weight to the vector component sensors so that the instrument platform, inclusive of its sensors and ancillary equipment, may be only lightly bottom-weighted. In an embodiment, the shielded electronics bay may be mounted in an upper cylindrically shaped part of the instrument platform and the vector component sensors (such as sensors 146 or 840 in FIGS. 1B and 9) may be mounted on the lower part of the instrument platform.

The ancillary sensor(s) and systems 1204 in FIG. 12 may also comprise a three-component static-field vector magnetometer. The three-component static-field vector magnetometer may sense the static magnetic field of the Earth. The three-component static field vector may be a DC-coupled vector magnetometer, and may be a different magnetometer than an EM sensor, which may be an AC-coupled sensor. For example, an EM sensor may comprise a search coil magnetometer with a low pass cut off at 1 Hz and a noise floor of 1 pT/root-Hz at 1 Hz. The three-component static field vector magnetometer may be a fluxgate magnetometer capable of sensing a static magnetic field with a noise floor of 10 pT/root-Hz at 1 Hz.

The ancillary sensor(s) and system 1204 may comprise a high-precision, three-component accelerometer disposed proximately to the air bearing, such as accelerometer 164 illustrated in FIG. 1C.

The latching system 1208 is optional and may be employed to lock the instrument platform in a fixed position relative to the base assembly (and/or pedestal to which the spherical bearing is mounted) while electromagnetic data are not being acquired. The latching system 1208 may be activated with compressed air and may receive instructions to secure and release the instrument platform from the first controller 1210. Latching system 1208 may be mounted on the top of a pedestal (such as the post 144, 710 or 810 in FIGS. 1B, 7, 8 and 9). The latching system 1208 may comprise pneumatically activated dogs that rise upwardly from the post to engage instrument platform 1201 and lock it into position.

Embodiments are not limited to the particular configuration of the system 1200 shown in FIG. 12. For example, in some embodiments, a single controller may be used to control all elements of the system. One or more of the ancillary sensors and systems 1204, the righting system 1206 and the latching system 1208 may be omitted. Similarly, the data recorder 1216 may be omitted from the system 1200, and data may be transmitted to an external database for storage. Other variations are also possible.

The righting system 1206 in FIG. 12 may be used to apply torque to the instrument platform to cause it to rotate about its center of rotation. The righting system may include its own controller (not shown), which may comprise a processor and/or memory. In other embodiments, the control of the righting system may be implemented by the first controller 1210.

The applied torque may change the orientation of the instrument platform or its angular velocity. In this embodiment, the righting system 1206 is disposed on the instrument platform 1201, and receives instructions from the first controller 1210. However, other arrangements are also possible.

The righting system 1206 may comprise fans or other means of propelling air to create thrust. The propelling of air may apply torque about the center of rotation, causing the instrument platform 1201 to rotate. The righting system 1206 may comprise means to propel air in three independent angular directions, and may comprise means to provide forward or reverse thrust in each of these directions. The righting system 1206 may comprise three independently oriented, reversible fans (e.g. 654a, 654b and 654c shown in FIG. 6B), or it may comprise a fan that may be pivoted to direct thrust in a particular direction. The righting system 1206 may comprise a fan affixed to the instrument platform that may direct air through moveable channels, louvres or vanes such that the direction of its thrust may be varied.

In addition or alternatively, the righting system 1206 may comprise a moveable weight. The position of the moveable weight may be adjusted to vary the gravitational torque acting on the instrument platform. The gravitational torque may be varied to oppose the pendular motion of the instrument platform. In an embodiment, gravitational torques may be adjusted continuously as data are acquired to damp the pendular motion of the instrument platform.

In one embodiment, the righting system 1206 comprises fans disposed on the upper part of the instrument platform to provide thrust in three independent angular orientations. The righting system may be operated periodically when the instrument platform tilts sufficiently close to its limiting tilt angle (e.g. the angle $\alpha$ in FIG. 7), and/or prior to commencing EM or other vector component data acquisition to depose the instrument platform upwardly and with small angular velocity.

In some embodiments, the system described herein is used for airborne electromagnetic surveys. The instrument platform 1201 may pendulate free of the post, to which the spherical bearing is mounted, for sufficiently long to complete a single flight line of an EM survey. During the transitions from line to line in a survey, or as the instrument platform tilts unacceptably close to the post, the instrument platform 1201 may be returned to an upright position with the righting system 1206. As the instrument platform 1201 is righted, the principal axis of the instrument platform 1201 may move to an attitude that is approximately parallel to post axis with an angular velocity close to zero. Electromagnetic data acquisition may be suspended as the instrument platform 1201 is rotated by the righting system 1206 because its operation may introduce either electromagnetic or vibration-induced motion noise that is unacceptably high.

The righting system 1206 may comprise an angular motion measurement system. The angular motion measurement system may comprise a controller and angular measurement means for detecting the angular motion of the instrument platform 1201. An angular motion measurement system may track the angular disposition of the instrument platform with respect to its tilt angle, and/or track its angular velocity. Angular measurement means for detecting the angular motion of the instrument platform may comprise a dc-coupled vector magnetometer, tilt sensors, accelerometers, rate gyros and/or rotation rate sensors affixed to the instrument platform 1201. In an embodiment, the controller of the righting system 1206 may accept signals from the angular measurement means. The controller may compute the tilt of the instrument platform 1201 and control the righting system 1206. The controller may issue commands to the righting system 1206 to reorient the instrument platform 1201 or to substantially reduce its angular motion. In an alternative embodiment, an angular motion measurement system may be comprised by ancillary sensors and systems 1204 rather than by righting system 1206.

In some embodiments, one or more components of the apparatus described herein may be constructed from highly resistive and non-magnetically permeable materials to reduce electromagnetic noise that may result from eddy current induction and magnetization. Electronic components may be shielded by mu-metal or other highly permeable or conductive materials to suppress electromagnetic noise, keeping it from interfering with measurements of EM survey data. Highly resistive and non-magnetically permeable materials that may be used include, but are not limited to carbon fiber, glass fiber or natural fiber composites, aramids, plastics, wood, rubber, ceramics and glass.

Figure 13:
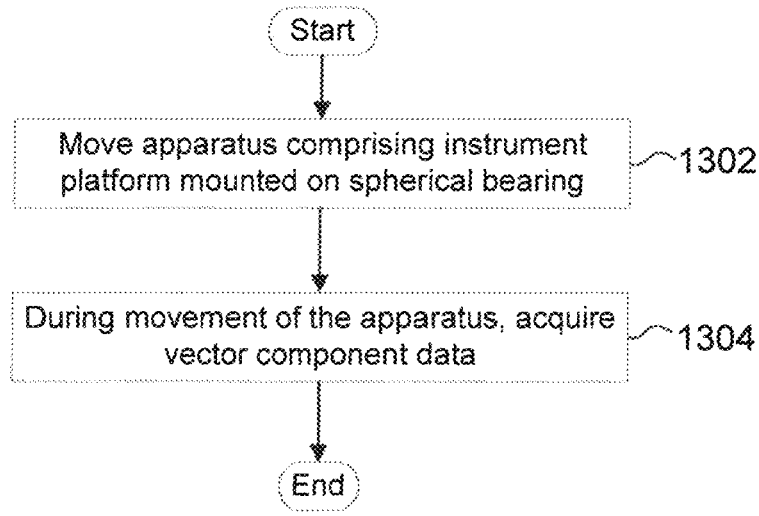
FIG. 13 is a flowchart of a method for data acquisition from a moving instrument platform having at least one vector component sensor fixed thereto, according to some embodiments.

FIG. 13 is a flowchart of a method for data acquisition from a moving instrument platform having at least one vector component sensor fixed thereto, according to some embodiments.

At block 1302, an apparatus comprising the instrument platform (including a vector component sensor) is moved. The apparatus may be similar to any of the example embodiments described above, comprising: a base assembly; a spherical bearing mounted on the base assembly; and the instrument platform mounted on the spherical bearing. The instrument platform is bottom weighted in that it has a center of mass disposed below its center of rotation. The apparatus may also comprise a carrier (such as carrier 101 shown in FIGS. 1A, 1B and 1D.

Moving the apparatus may comprise towing the apparatus with a vehicle, mounting the apparatus to a moving vehicle or other moving body, or carrying the apparatus, to name a few examples.

At block 1304, during movement of the apparatus, vector component data are acquired using the at least one vector component sensor.

In some embodiments, a high precision three-component accelerometer (such as accelerometer 164 in FIG. 1C) is mounted on the instrument platform and disposed adjacent to the spherical bearing. A transfer function may be used as a mathematical relationship means to compute the wobble angular motion from the measured acceleration. Wobble motion noise may then be computed from the motion noise equations.

Figure 14:
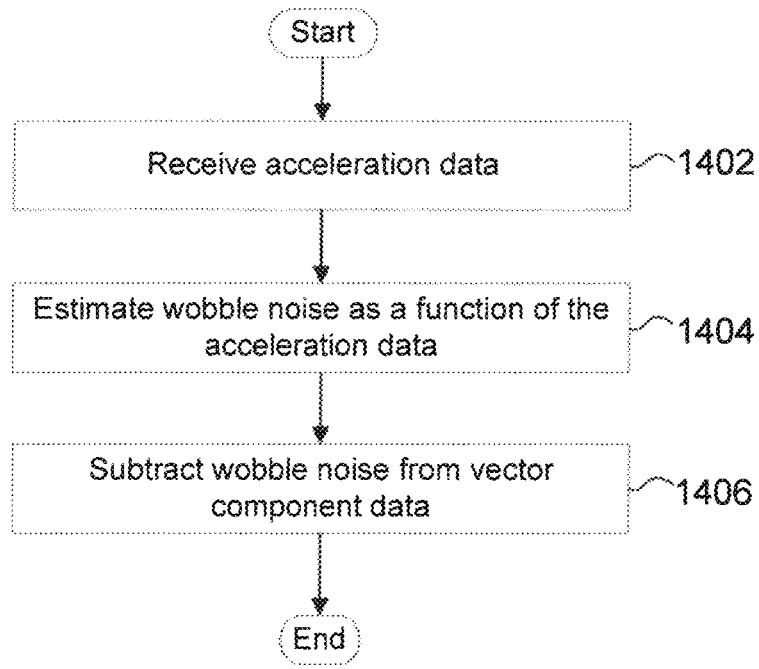
FIG. 14 is a flowchart of an example method for correcting for wobble noise according to some embodiments.

FIG. 14 is a flowchart of an example method, in the apparatus described above, for correcting for wobble noise according to some embodiments. The method may, for example, be performed by a controller, such as the first controller 1210 in FIG. 12, or any other suitable data processing means.

At block 1402, acceleration data is received from the accelerometer.

At block 1404, wobble noise is estimated as a function of the acceleration data. This estimation may comprise computing rotational motion from the high-precision three-component accelerometer input. Then, the wobble noise may be estimated from motion noise equations using the computed angular change and the measured static magnetic field of the Earth. The static magnetic field of the Earth may, for example, be obtained from a three-component dc-coupled vector magnetometer affixed to the instrument platform.

At block 1406, the estimated wobble noise is subtracted from the vector component sensor data, which may yield an improved measurement with reduced motion noise.

In some embodiments, motion noise may be further reduced by measuring the angular motions of the instrument platform and correcting the EM sensor data accordingly. The apparatus may comprise a vector component static field magnetometer and an angular motion measurement sensor mounted to the instrument platform. One method that may be employed is to first compute the motion noise with the rotational motion noise equations, $$Nc = m \cdot (\omega \times B),$$

$$Nm = m \cdot (\Delta\Theta \times B), \text{ or}$$

$$N = m \cdot (A \times F).$$

and then to subtract the computed noise from the data. The controller of the apparatus may, for example, estimate the motion noise based on data received from attitude measurement means and the angular motion measurement sensor. In practice, however, for the case of EM data, direct angular measurements may not be sufficiently precise to render an accurate noise estimate, at least to picoTesla resolution in the sub 20 Hertz band with presently available instrumentation and a transfer function approach, or other mathematical means, to infer angular motion from acceleration measurements may be required in lieu of using direct angular measurements.

It is to be understood that a combination of more than one of the above approaches may be implemented in some embodiments. Embodiments are not limited to any particular one or more of the approaches, methods or apparatuses disclosed herein. One skilled in the art will appreciate that variations, alterations of the embodiments described herein may be made in various implementations without departing from the scope thereof. It is therefore to be understood that within the scope of the appended claims, the disclosure may be practiced otherwise than as specifically described herein.

What has been described is merely illustrative of the application of the principles of the disclosure. Other arrangements and methods can be implemented by those skilled in the art without departing from the scope of the present disclosure.

The invention claimed is:

1. An apparatus for vector component data acquisition comprising:
   a base assembly;
   a spherical bearing mounted to the base assembly; and
   an instrument platform having at least one vector component sensor fixed thereto, the instrument platform being mounted on and supported by the spherical bearing, the spherical bearing thereby coupling the instrument platform to the base assembly and allowing free angular rotation of the instrument platform, within a tilt angle range, about the spherical bearing such that the instrument platform has a center of rotation;
   wherein the instrument platform has a center of mass disposed below the center of rotation.

2. The apparatus of claim 1, wherein the instrument platform is configured to pendulate about the center of rotation such that motion noise within an acquisition band of the at least one vector component sensor is suppressed.

3. The apparatus of claim 1, wherein the instrument platform has a natural pendular frequency that is lower than a lowest frequency of an acquisition band of the at least one vector component sensor.

4. The apparatus of claim 1, wherein the instrument platform is rigid.

5. The apparatus of claim 1, further comprising a carrier, the base assembly being coupled to the carrier.

6. The apparatus of claim 5, wherein the carrier comprises a tow frame and a linkage coupling the base assembly to the tow frame.

7. The apparatus of claim 5, wherein the carrier is an airborne carrier configured to be towed by an airborne vehicle.

8. The apparatus of claim 1, wherein the spherical bearing is an air bearing.

9. The apparatus of claim 1, wherein the spherical bearing comprises the sole mechanical coupling between the base assembly and the instrument platform.

10. The apparatus of claim 1, wherein the at least one vector component sensor comprises three independently oriented vector component sensors.

11. The apparatus of claim 1, further comprising a controller, the controller comprising a processor and memory, wherein the controller receives data from said at least one sensor.

12. The apparatus of claim 11, wherein the controller stores the received data.

13. The apparatus of claim 11, further comprising wireless communication means, wherein the controller causes the wireless communication means to transmit the received data for storage in a database.

14. The apparatus of claim 1, wherein the base assembly comprises a pedestal, the spherical bearing being mounted to the pedestal.

15. The apparatus of claim 14, wherein the pedestal comprises a post disposed upwardly from the base assembly.

16. The apparatus of claim 1, wherein the at least one vector component sensor comprises at least one of:
   at least one electromagnetic sensor;
   at least one gravity sensor.

17. The apparatus of claim 1, wherein the at least one vector component sensor comprises at least one gradiometer sensor.

18. The apparatus of claim 1, wherein the instrument platform comprises a downward facing skirt, the downward facing skirt providing clearance about the spherical bearing and base assembly to allow the instrument platform a range of tilt rotation within the tilt angle range.

19. The apparatus of claim 1, further comprising:
   a righting system; and
   an angular motion measurement system, wherein the righting system applies, as a function of angular motion measured by the angular motion measurement system, righting torques to the instrument platform to cause it to rotate about the spherical bearing.

20. The apparatus of claim 19, wherein the righting system comprises one of:
   a plurality of thrusters disposed on the instrument platform, the thrusters applying said righting torques; and
   a plurality of movable mass assemblies disposed on the instrument platform, the movable mass assemblies applying said righting torques.

21. The apparatus of claim 19, wherein the righting torques are applied to at least one of:
   orient the bottom-weighted instrument platform toward its principal axis being substantially vertical; and
   reduce angular velocity.

22. The apparatus of claim 1, further comprising an accelerometer disposed on the instrument platform, the accelerometer measuring acceleration data, and wherein the controller is configured to:
   receive the acceleration data;
   estimate wobble noise as a function of the acceleration data;
   and subtract wobble noise from data acquired from the at least one vector component sensor.

23. A method for vector component data acquisition from a moving instrument platform having at least one vector component sensor fixed thereto, the method comprising:
   moving an apparatus comprising: a base assembly; a spherical bearing mounted to the base assembly; and the instrument platform, the instrument platform being mounted on and supported by the spherical bearing, the spherical bearing thereby coupling the instrument platform to the base assembly and allowing free angular rotation of the instrument platform, within a tilt angle range, about the spherical bearing such that the instrument platform has a center of rotation, the instrument platform having a center of mass disposed below the center of rotation; and
   during movement of the apparatus, acquiring vector component data using the at least one vector component sensor.

24. The method of claim 23, wherein the apparatus further comprises a carrier, the base assembly being coupled to the carrier, and moving the apparatus comprises towing the carrier.

25. The method of claim 23, wherein the instrument platform is configured to pendulate about the center of rotation such that motion noise within an acquisition band of the at least one vector component sensor is suppressed.

* * * * *